(12) United States Patent
Yamazaki

(10) Patent No.: US 10,032,872 B2
(45) Date of Patent: Jul. 24, 2018

(54) SEMICONDUCTOR DEVICE, METHOD FOR MANUFACTURING THE SAME, AND APPARATUS FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 449 days.

(21) Appl. No.: 14/277,508

(22) Filed: May 14, 2014

(65) Prior Publication Data
US 2014/0339545 A1  Nov. 20, 2014

(30) Foreign Application Priority Data

May 17, 2013  (JP) .................................. 2013-105621

(51) Int. Cl.
*H01L 29/00* (2006.01)
*H01L 29/24* (2006.01)
(Continued)

(52) U.S. Cl.
CPC .............. *H01L 29/24* (2013.01); *C23C 14/08* (2013.01); *C23C 14/3464* (2013.01);
(Continued)

(58) Field of Classification Search
CPC ............... H01L 29/24; H01L 21/02617; H01L 21/02565; H01L 21/67017;
(Continued)

(56) References Cited

U.S. PATENT DOCUMENTS

| 444,643 A | 4/1984 | Garrett |
| 4,444,643 A | 4/1984 | Garrett |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Dale E Page
*Assistant Examiner* — Quovaunda V Jefferson
(74) *Attorney, Agent, or Firm* — Nixon Peabody LLP; Jeffrey L. Costellia

(57) ABSTRACT

To manufacture a semiconductor device using an oxide semiconductor with high reliability and less variation in electrical characteristics, objects are to provide a method for manufacturing a semiconductor device with which an oxide semiconductor film with a fairly uniform thickness is formed, a manufacturing apparatus, and a method for manufacturing a semiconductor device with the manufacturing apparatus. In order to form an oxide semiconductor film with a fairly uniform thickness with use of a sputtering apparatus, an oxide semiconductor film the thickness uniformity of which is less than ±3%, preferably less than or equal to ±2% is formed by using a manufacturing apparatus in which a deposition chamber is set to have a reduced pressure atmosphere, preferably, to have a high degree of vacuum and power is adjusted to be applied uniformly to the entire surface of a substrate during film deposition.

10 Claims, 18 Drawing Sheets

(51) Int. Cl.
  *H01L 21/02* (2006.01)
  *H01L 21/67* (2006.01)
  *H01J 37/34* (2006.01)
  *C23C 14/35* (2006.01)
  *C23C 14/08* (2006.01)
  *C23C 14/34* (2006.01)
  *C23C 14/56* (2006.01)
  *H01J 37/32* (2006.01)
  *H01L 21/677* (2006.01)
  *H01L 29/66* (2006.01)
  *H01L 29/786* (2006.01)

(52) U.S. Cl.
  CPC ............ *C23C 14/35* (2013.01); *C23C 14/351* (2013.01); *C23C 14/56* (2013.01); *C23C 14/564* (2013.01); *C23C 14/566* (2013.01); *H01J 37/32724* (2013.01); *H01J 37/32899* (2013.01); *H01J 37/3405* (2013.01); *H01J 37/3417* (2013.01); *H01J 37/3435* (2013.01); *H01J 37/3447* (2013.01); *H01J 37/3455* (2013.01); *H01L 21/02554* (2013.01); *H01L 21/02565* (2013.01); *H01L 21/02631* (2013.01); *H01L 21/67017* (2013.01); *H01L 21/6719* (2013.01); *H01L 21/67196* (2013.01); *H01L 21/67207* (2013.01); *H01L 21/67748* (2013.01); *H01L 29/66969* (2013.01); *H01L 29/7869* (2013.01)

(58) Field of Classification Search
  CPC ........... H01L 29/66545; H01L 29/6656; H01L 29/78; H01L 29/517; H01L 29/42372; H01L 29/513; H01L 29/518; H01L 29/512; H01L 21/32133; H01L 21/31111; H01L 21/02164; H01L 21/0217; H01J 37/3405; H01J 37/3455; H01J 37/3435; C23C 14/05; C23C 14/3464; C23C 14/35; C23C 14/361; C23C 14/56; C23C 14/564; C23C 14/566
  See application file for complete search history.

(56) References Cited

U.S. PATENT DOCUMENTS

| | | | |
|---|---|---|---|
| 5,213,672 A | 5/1993 | Hartig et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,322,679 B1* | 11/2001 | De Bosscher | H01J 37/3408 204/192.12 |
| 6,416,639 B1 | 7/2002 | Kanazawa et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,347,919 B2 | 3/2008 | Sato et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,129,717 B2 | 3/2012 | Yamazaki et al. | |
| 8,133,360 B2 | 3/2012 | Miller et al. | |
| 8,460,522 B2 | 6/2013 | Oishi et al. | |
| 8,753,921 B2 | 6/2014 | Fujita et al. | |
| 9,469,897 B2 | 10/2016 | Chikama et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0079984 A1* | 5/2003 | Okatani | C23C 14/225 204/192.12 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0094412 A1 | 5/2004 | Navala et al. | |
| 2004/0127038 A1 | 7/2004 | Carcia et al. | |
| 2005/0005846 A1* | 1/2005 | Selvamanickam | C23C 14/087 118/718 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0081458 A1* | 4/2006 | Ford | C23C 14/35 204/192.1 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |

(56) References Cited

U.S. PATENT DOCUMENTS

| | | | |
|---|---|---|---|
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0043198 | A1* | 2/2012 | Yamazaki ............ C23C 14/086 204/192.1 |
| 2016/0053362 | A1 | 2/2016 | Yamazaki |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2004-346388 | A | 12/2004 |
| JP | 2007-096055 | | 4/2007 |
| JP | 2012-227503 | A | 11/2012 |
| WO | WO-2004/114391 | | 12/2004 |
| WO | WO-2008/050618 | | 5/2008 |
| WO | WO-2012/036079 | | 3/2012 |
| WO | WO-2012/077298 | | 6/2012 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering, ", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '09 : SID International Symposium Digest of Technical Papers, May 31, 2009, pp. 284-287.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW —06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn[ at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B.), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Musil.J, "Rectangular magnetron with full target erosion,", Journal of Vacuum Science & Technology A, 1999, vol. 17, No. 2, pp. 555-563.

(56) References Cited

OTHER PUBLICATIONS

Goto.T et al., "Rotation magnet sputtering: Damage-free novel magnetron sputtering using rotating helical magnet with very high target utilization,", Journal of Vacuum Science & Technology A, 2009, vol. 27, No. 4, pp. 653-659.

* cited by examiner 400 402  404

408

410a  410b 300  414

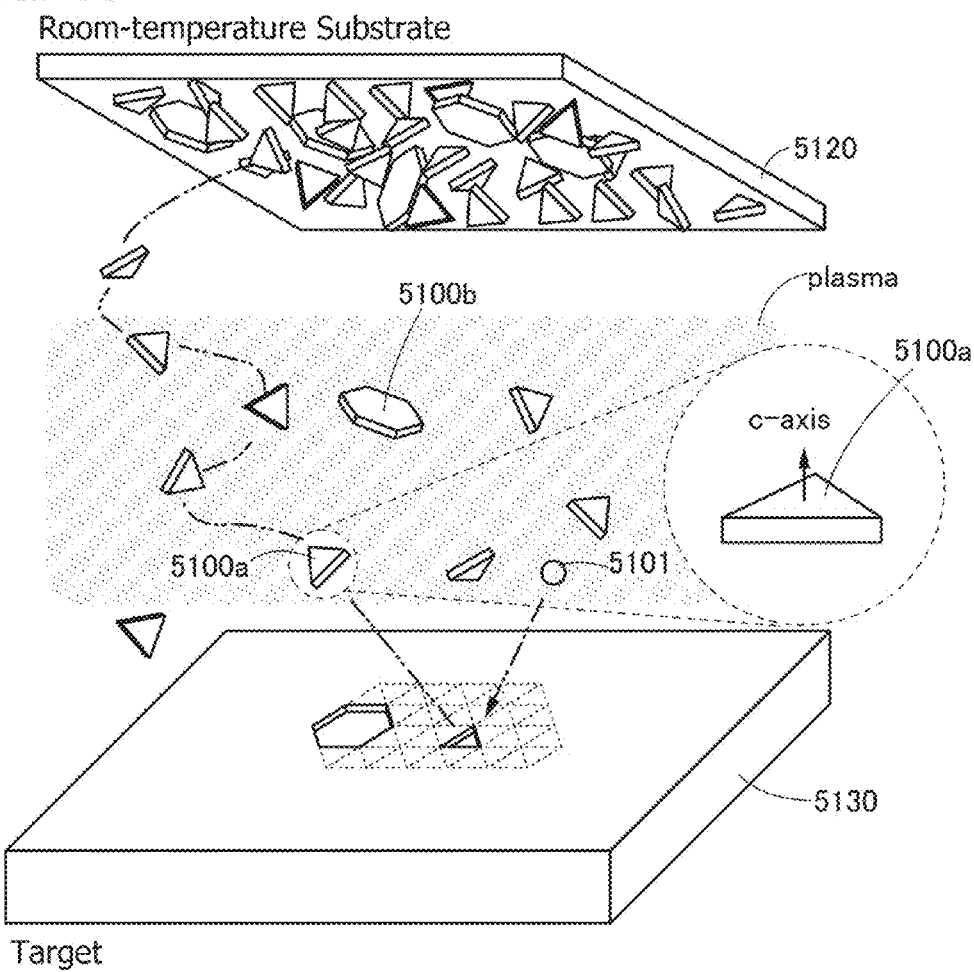

Heated Substrate

Heated Substrate

InGaZnO₄

In : ○  Ga : ○  Zn : ◉  O : ●

The Zn reaches the vicinity of the sixth layer (Ga-Zn-O) counted from the top

The Zn does not reach the fifth layer (In-O) counted from the top

SEMICONDUCTOR DEVICE, METHOD FOR MANUFACTURING THE SAME, AND APPARATUS FOR MANUFACTURING SEMICONDUCTOR DEVICE

BACKGROUND OF THE INVENTION

1. Field of the Invention

The present invention relates to a semiconductor device using an oxide semiconductor, a method for manufacturing the semiconductor device, and an apparatus used for forming an oxide semiconductor film.

Note that in this specification, a semiconductor device refers to any device that can function by utilizing semiconductor characteristics, and an electro-optical device, a semiconductor circuit, and an electronic device are all included in the category of semiconductor devices.

2. Description of the Related Art

A technique by which transistors are formed using semiconductor thin films formed over a substrate having an insulating surface has been attracting attention. Such transistors are applied to a wide range of electronic devices such as an integrated circuit (IC) and an image display device (display device). As materials of semiconductor thin films applicable to the transistors, silicon-based semiconductor materials have been widely used, but oxide semiconductors have been attracting attention as alternative materials.

For example, disclosure is made of a transistor having an active layer for which an oxide semiconductor that contains indium (In), gallium (Ga) and zinc (Zn) and has an electron carrier concentration less than $10^{18}/cm^3$ is used, and a sputtering method is considered the most suitable as a method of forming a film of the oxide semiconductor (see Patent Document 1).

Moreover, there is a trend in an active matrix semiconductor device typified by a liquid crystal display device towards a larger screen, e.g., a 60-inch diagonal screen, and further, the development of an active matrix semiconductor device is aimed even at a screen size of a diagonal of 120 inches or more. In addition, a trend in resolution of a screen is toward higher definition, e.g., high-definition (HD) image quality (1366×768) or full high-definition (FHD) image quality (1920×1080), and prompt development of a so-called 4K Digital Cinema display device, which has a resolution of 3840×2048 or 4096×2180, is also pushed.

Such an increase in the size of a semiconductor device leads to an increase in the size of a glass substrate for production of a liquid crystal panel, for example, from a size of 300 mm×400 mm called the first generation to a size of 550 mm×650 mm of the third generation, 730 mm×920 mm of the fourth generation, 1000 mm×1200 mm of the fifth generation, 1450 mm×1850 mm of the sixth generation, 1870 mm×2200 mm of the seventh generation, 2000 mm×2400 mm of the eighth generation, 2400 mm×2800 mm of the ninth generation, or 2880 mm×3080 mm of the tenth generation. The size of a glass substrate is expected to be further increased to the size of the eleventh generation or the twelfth generation in the future.

REFERENCE

Patent Document

[Patent Document 1] Japanese Published Patent Application No. 2007-096055

SUMMARY OF THE INVENTION

There have also been cases where transistors using oxide semiconductors show great variation in electrical characteristics within one substrate, from substrate to substrate, or from lot to lot. Thus, an object is to manufacture a highly reliable semiconductor device using an oxide semiconductor, which has less variation in electrical characteristics, and a method for manufacturing a semiconductor device in which an oxide semiconductor film with a fairly uniform thickness is formed, a manufacturing apparatus, and a method for manufacturing a semiconductor device with use of the manufacturing apparatus are provided.

Another object is to provide a manufacturing apparatus which enables mass production of semiconductor devices with less variation in electrical characteristics with use of a large-sized glass substrate such as a mother glass.

One embodiment of the present invention is to form an oxide semiconductor film the thickness uniformity of which is less than ±3%, preferably less than or equal to ±2%, with use of a manufacturing apparatus in which a deposition chamber is set to have a reduced pressure atmosphere, preferably to have a high degree of vacuum and power is adjusted to be applied uniformly to the entire surface of a substrate during film deposition, in order to form an oxide semiconductor film with a fairly uniform thickness with use of a sputtering apparatus.

A semiconductor device including an oxide semiconductor film the thickness uniformity of which is less than ±3%, preferably less than or equal to ±2% can have less variation within one substrate, from substrate to substrate, or from lot to lot and thus can be a semiconductor device using an oxide semiconductor with less variation in electrical characteristics.

When the film thickness of the oxide semiconductor film fluctuates widely, a difference in the amount of oxygen vacancies in the oxide semiconductor film according to the thickness may be caused, which leads to a possibility of a reduction in reliability. Thus, an oxide semiconductor film the thickness uniformity of which is less than ±3%, preferably less than or equal to ±2% is achieved, whereby a highly reliable semiconductor device can be obtained.

Another embodiment of the present invention is a method for manufacturing a semiconductor device in which an oxide semiconductor film the thickness uniformity of which is less than ±3%, preferably less than or equal to ±2% is formed over a substrate, and the thickness uniformity of the oxide semiconductor film is controlled with at least one of a means for swinging a part of a sputtering apparatus during film deposition, an adjustment of power supply of the sputtering apparatus, and an adjustment of pressure in a deposition chamber of the sputtering apparatus. The means for swinging a part of the sputtering apparatus during film deposition is not particularly limited, and a part or a plurality of portions of the sputtering apparatus and another portion of the sputtering apparatus may be relatively moved, so that the plasma density can be uniformed.

In the above structure, in order to set the thickness uniformity of the oxide semiconductor film to be less than ±3%, the oxide semiconductor film is deposited over a substrate preferably in the following manner: the substrate is introduced into a deposition chamber of the sputtering apparatus that is vacuum evacuated and has a leakage rate lower than or equal to $1\times10^{-10}$ Pa·m$^3$/sec.; a deposition gas with a purity higher than or equal to 99.999999% is introduced into the deposition chamber; and a sputtering target is sputtered with use of the deposition gas.

Further, in the above structure, it is preferable that the substrate temperature at deposition of the oxide semiconductor film be higher than or equal to 50° C. and lower than or equal to 450° C., and with the high substrate temperature, an oxide semiconductor film with high crystallinity can be obtained. Furthermore, the oxide semiconductor film with high crystallinity includes a region with crystallinity, and the region has crystals whose c-axes are aligned in a direction substantially perpendicular to a film surface. Thus, a highly reliable semiconductor device with less variation in electrical characteristics can be achieved. Note that the oxide semiconductor film with high crystallinity is referred to as a CAAC-OS (c-axis aligned crystalline oxide semiconductor) film. The CAAC-OS film is one of the oxide semiconductor layers including a plurality of c-axis aligned crystal parts.

A combined analysis image of a bright-field image and a diffraction pattern (also referred to as high resolution TEM image) of the CAAC-OS film is observed with a transmission electron microscope (TEM), whereby a plurality of crystal parts can be found. Meanwhile, a boundary between clear crystal parts, that is, grain boundary, cannot be observed even in the high resolution TEM image. Thus, in the CAAC-OS film, a reduction in electron mobility due to the grain boundary is less likely to occur.

According to the high resolution TEM image of a cross section of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. On the other hand, according to the high resolution TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm.

From the results of the cross-sectional high resolution TEM image and the plan high resolution TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan high resolution TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional high resolution TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31 and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a lowering of crystallinity. Further, a heavy metal such as iron or nickel, argon, carbon dioxide, or the like has a large atomic radius (molecular radius), and thus disturbs the atomic arrangement of the oxide semiconductor film and causes a lowering of crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and thus high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With use of the CAAC-OS film in a transistor, variation in the electrical characteristics of the transistor due to irradiation with visible light or ultraviolet light is small.

In addition, another embodiment of the present invention is a manufacturing apparatus that achieves a method for manufacturing the semiconductor device. The manufacturing apparatus that is used to manufacture a semiconductor device includes a sputtering apparatus including a supply source of a deposition gas, a power supply, a vacuum evacuation means, a substrate-heating means, and a means for swinging a part of the sputtering apparatus. A thickness uniformity of an oxide semiconductor film is controlled with at least one of the means for swinging a part of the sputtering apparatus, an adjustment of the power supply of the sputtering apparatus, and an adjustment of a pressure in a deposition chamber of the sputtering apparatus, and the thickness uniformity of the oxide semiconductor film is less than ±3%.

Furthermore, the purity of the deposition gas is important for setting the thickness uniformity of the oxide semiconductor film to be less than ±3%, and a gas refiner that increases the purity of the deposition gas is preferably provided between the supply source of the deposition gas and the deposition chamber. The length of a pipe between the gas refiner and the deposition chamber is less than or equal to 5 m, preferably less than or equal to 1 m.

The means for swinging a part of the sputtering apparatus indicates a device swinging a magnet provided inside or below a target holder, a device swinging a target holder, or both the devices, specifically in the case where a magnetron sputtering method is used. In order to set the thickness uniformity of the oxide semiconductor film to be less than ±3%, it is preferable that the device swinging a magnet and the device swinging the target holder be operated independently.

In the case where a film is deposited on a large-sized glass substrate, particularly, such as a mother glass with a sputtering apparatus, a plurality of sputtering targets are provided and arranged in the target holder. In such a case, a distance between targets is generated in a lateral or vertical direction of the substrate, and thus a difference in the uniformity of film thickness might be caused between the lateral direction of the substrate and the vertical direction of the substrate. The device swinging the magnet and the device swinging the target holder are independently operated during film deposition, whereby the difference between the uniformity of film thickness in the lateral direction of the substrate and the uniformity of film thickness in the vertical direction of the substrate can be reduced; accordingly, the thickness uniformity of the oxide semiconductor film can be made to be less than ±3%. In this specification, the thickness uniformity indicates the thickness distribution in a film formed over one substrate. The film thickness is measured at each point on the substrate surface by a spectroscopic ellipsometry method, and the thickness distribution in the film, that is, the thickness uniformity, is calculated from the measurement results. For example, after a 100-nm-thick oxide semiconductor film is formed over a 5-inch glass substrate or a 5-inch silicon wafer, with use of an ellipsometer, the thickness measurement is performed at 25 points in a range 100 mm×100 mm in a central portion of the substrate. The thickness distribution X of the oxide semiconductor film can be obtained in accordance with the following formula: $X\ (\%) = (R_{max} - R_{min})/R_{ave} \times 100$ where $R_{max}$, $R_{min}$, and $R_{ave}$ represent the maximum value, the minimum value, and the average value of the oxide semiconductor film, respectively. For example, the sentence "the thickness uniformity is lower than ±3%" means that an absolute value of the thickness distribution X obtained from date of thickness measurement at 25 points is lower than ±3%.

In this specification, the reduced-pressure atmosphere refers to a pressure of 10 Pa or lower. Further, the inert atmosphere refers to an atmosphere containing an inert gas (such as nitrogen or a rare gas (e.g., helium, neon, argon, krypton, or xenon)) as the main component, and preferably contains no hydrogen. For example, the purity of the inert gas to be introduced is 8N (99.999999%) or higher, preferably 9N (99.9999999%) or higher. Alternatively, the inert atmosphere refers to an atmosphere that contains an inert gas as the main component and contains a reactive gas at a concentration lower than 0.1 ppm. The reactive gas is a gas that reacts with a semiconductor, metal, or the like.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

According to one embodiment of the present invention, a method for manufacturing a semiconductor device having stable electrical characteristics and high reliability can be provided. In addition, a manufacturing apparatus with which a semiconductor device having stable electrical characteristics and high reliability is achieved can be provided. Further, a manufacturing apparatus which enables mass production of highly reliable semiconductor devices with use of a large-sized substrate such as a mother glass can be provided.

Furthermore, a method for manufacturing a semiconductor device having stable electrical characteristics and high reliability can be provided.

BRIEF DESCRIPTION OF THE DRAWINGS

FIG. 10 illustrates a deposition model of an nc-OS schematically and a pellet.

DETAILED DESCRIPTION OF THE INVENTION

Embodiments of the present invention will be described below in detail with reference to the drawings. Note that the present invention is not limited to the following description, and it is easily understood by those skilled in the art that modes and details disclosed herein can be modified in various ways. Further, the present invention is not construed as being limited to description of the embodiments.

Embodiment 1

In this embodiment, an example of a method for manufacturing a semiconductor device including an oxide semiconductor film the thickness uniformity of which is less than ±3%, and an example of a specific structure will be described with reference to drawings.

An example of a method for manufacturing a semiconductor device will be described with reference to FIGS. 1A to 1D.

Figure 1A:
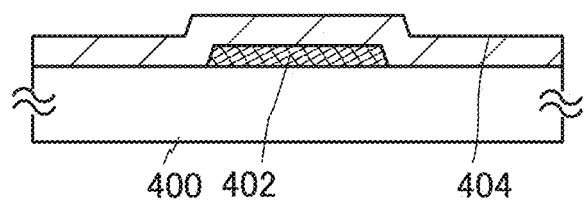
FIGS. 1A to 1D are cross-sectional views illustrating a manufacturing process of a semiconductor device of one embodiment of the present invention.

First, a gate electrode layer 402 (including a wiring formed using the same layer) is formed over a substrate 400, and a gate insulating layer 404 is formed over the gate electrode layer 402 (see FIG. 1A).

There is no particular limitation on the property of a material and the like of the substrate 400 as long as the material has heat resistance high enough to withstand at least heat treatment to be performed later. For example, a glass substrate, a ceramic substrate, a quartz substrate, a sapphire substrate, or the like can be used as the substrate 400. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 400. Furthermore, any of these substrates further provided with a semiconductor element may be used as the substrate 400.

Alternatively, a flexible substrate may be used as the substrate 400, and the transistor 300 may be provided directly on the flexible substrate. Alternatively, a separation layer may be provided between the substrate 400 and the transistor 300. The separation layer can be used when part or the whole of a semiconductor device formed over the separation layer is completed and separated from the substrate 400 and transferred to another substrate. In such a case, the transistor 300 can be transferred to a substrate having low heat resistance or a flexible substrate.

A base insulating layer may be provided between the substrate 400 and the gate electrode layer 402. In the case where a substrate provided with a semiconductor element is used as the substrate 400, the base insulating layer can function as an interlayer insulating layer.

The gate electrode layer 402 can be formed using a metal material such as molybdenum, titanium, tantalum, tungsten, aluminum, copper, chromium, neodymium, or scandium or an alloy material that contains any of these materials as its main component. Alternatively, a semiconductor film typified by a polycrystalline silicon film doped with an impurity element such as phosphorus, or a silicide film such as a nickel silicide film may be used as the gate electrode layer 402. The gate electrode layer 402 has either a single-layer structure or a stacked structure. The gate electrode layer 402 may have a tapered shape with a taper angle greater than or equal to 15° and less than or equal to 70° for example. Here, the taper angle refers to an angle formed between a side surface of a layer having a tapered shape and a bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode layer 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode layer 402 is formed using any of these materials, the threshold voltage can be positive in the electrical characteristics of the transistor, so that the transistor can be a normally-off switching transistor.

As the gate insulating layer 404, a film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. The gate insulating layer 404 may be formed with either a single-layer structure or a stacked structure.

Note that in the gate insulating layer 404, a region to be in contact with the oxide semiconductor layer 408 which is formed later is preferably an oxide insulating layer and preferably has a region (oxygen excess region) containing oxygen in excess of the stoichiometric composition. In order to provide the oxygen-excess region in the gate insulating layer 404, for example, the gate insulating layer 404 may be formed in an oxygen atmosphere. Alternatively, oxygen may be introduced into the formed gate insulating layer 404 to provide the oxygen-excess region. As a method for introducing oxygen, an ion implantation method, an ion doping method, a plasma immersion ion implantation method, plasma treatment, or the like may be employed.

Figure 1B:
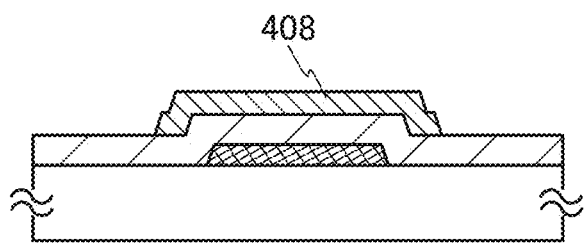
Figure 1C:
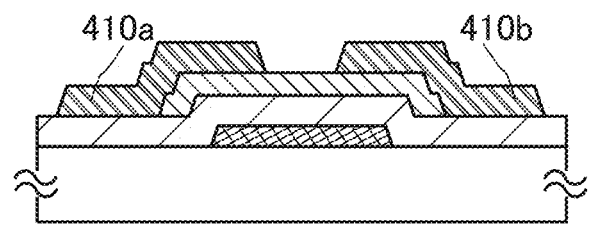
Figure 1D:
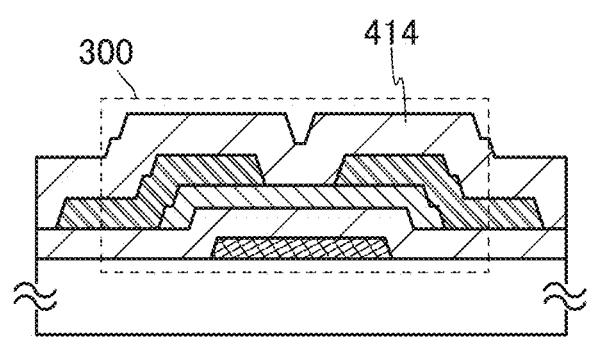

Next, an oxide semiconductor film is formed over the gate insulating layer 404 and processed into an island shape to form the oxide semiconductor layer 408 (see FIG. 1B). The oxide semiconductor layer 408 preferably includes a film represented by an In—M—Zn oxide that contains at least indium (In), zinc (Zn), and M (metal such as Al, Ga, Ge, Y, Zr, Sn, La, Ce, or Hf). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in the oxide semiconductor layer 408, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Z-based oxide may contain another metal element in addition to In, Ga, and Zn.

The oxide semiconductor layer 408 may have a single-layer structure or a stacked structure of a plurality of oxide semiconductor layers. For example, the oxide semiconductor layer 408 may be a stacked layer of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using three-component metal oxides.

Further, the constituent elements of the first oxide semiconductor layer and the second oxide semiconductor layer may be the same as each other but the composition of the constituent elements of the first oxide semiconductor layer and the second oxide semiconductor layer may be different from each other. For example, the first oxide semiconductor layer may have an atomic ratio of In:Ga:Zn=1:1:1, and the second oxide semiconductor layer may have an atomic ratio of In:Ga:Zn=1:3:2.

Further, oxide semiconductor layers having different crystallinities may be used for the first oxide semiconductor layer and the second oxide semiconductor layer. That is, the oxide semiconductor layer may be formed using an appropriate combination of a single crystal oxide semiconductor layer, a polycrystalline oxide semiconductor layer, a microcrystalline oxide semiconductor layer, an amorphous oxide semiconductor layer, and a CAAC-OS film. Note that an amorphous oxide semiconductor layer is likely to absorb impurities such as hydrogen which serves as donors, and is likely to be n-type because oxygen vacancies are easily caused. Thus, the oxide semiconductor layer provided on the channel side is preferably formed using a crystalline oxide semiconductor film such as a CAAC-OS film.

Here, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

The oxide semiconductor film is deposited with a magnetron sputtering apparatus. The thickness of depositing oxide semiconductor film is controlled to be uniform with at least one of a means for swinging part of the sputtering apparatus during film deposition, an adjustment of a power supply of the sputtering apparatus, and an adjustment of a pressure in a deposition chamber of the sputtering apparatus.

As a means for swinging part of the sputtering apparatus during film deposition, a magnetron sputtering apparatus including a device swinging at least a magnet is used. Alternatively, as a means for swinging part of the sputtering apparatus during film deposition, it is preferable to use a magnetron sputtering apparatus in which a device swinging a target holder with a plurality of targets is further provided and the swinging devices are independently controlled. Note that in order to set the thickness uniformity of the oxide semiconductor film to be less than ±3%, further less than or equal to ±2%, it is preferable to use all of the means for swinging part of the sputtering apparatus during film deposition, the adjustment of power supply of the sputtering apparatus, and the adjustment of a pressure of the deposition chamber of the sputtering apparatus.

For the magnetron sputtering apparatus, a coaxial cylindrical magnetron system, a gun-type magnetron system, a planar-type magnetron system, or the like can be used. Here, a planar-type magnetron system is used.

In order to set the thickness uniformity of the oxide semiconductor film to be less than ±3%, it is preferable that the concentration of hydrogen contained in the oxide semiconductor film at the time of deposition be as low as possible. To reduce the hydrogen concentration, for example, in the case of a sputtering method, a deposition chamber needs to be highly evacuated and also a sputtering gas needs to be highly purified. As an oxygen gas or an argon gas used for a sputtering gas, a gas which is highly purified to have a dew point of −40° C. or lower, preferably −80° C. or lower, further preferably −100° C. or lower, further preferably −120° C. or lower is used, whereby entry of moisture or the like into the oxide semiconductor layer 408 can be prevented as much as possible.

When the thickness uniformity of the oxide semiconductor film is less than ±3%, crystals in which c-axes are aligned in a direction substantially perpendicular to the film surface are easily formed, and accordingly a film including no crystal with a spinel structure can be formed. There is a possibility that a variation in film quality is caused when both a crystal whose c-axis is aligned in the direction substantially perpendicular to the film surface and a crystal with a spinel structure exist. For this reason, a preferred deposition condition of the oxide semiconductor film is such that a crystal with a spinel structure is not formed.

In order to remove moisture remaining in the deposition chamber, an entrapment vacuum pump, such as a cryopump, an ion pump, or a titanium sublimation pump, is preferably used. The evacuation unit may be a turbo molecular pump provided with a cold trap. Since a cryopump has a high capability in removing a compound including a hydrogen atom such as a hydrogen molecule and water ($H_2O$) (preferably, also a compound including a carbon atom), and the like, the concentration of an impurity contained in a film formed in the deposition chamber evacuated with the cryopump can be reduced.

Further, in the case where the oxide semiconductor film is formed by a sputtering method, the relative density (the fill rate) of a metal oxide target which is used for forming the oxide semiconductor film is set to higher than or equal to 90% and lower than or equal to 100%, preferably higher than or equal to 95% and less than or equal to 99.9% so that the thickness uniformity of the oxide semiconductor film is less than ±3%. With use of the metal oxide target having high relative density, a dense oxide film can be formed.

Note that formation of the oxide semiconductor film while the substrate 400 is kept at high temperature is also effective in reducing the impurity concentration in the oxide semiconductor film so as to set the thickness uniformity of the oxide semiconductor to be less than ±3%. The heating temperature of the substrate 400 is higher than or equal to 50° C. and lower than or equal to 450° C., and preferably the substrate temperature is higher than or equal to 200° C. and lower than or equal to 350° C.

After forming the oxide semiconductor film or processing the oxide semiconductor film to be the island-shaped oxide semiconductor layer 408, heat treatment is performed. The heat treatment is preferably performed at a temperature higher than or equal to 250° C. and lower than or equal to 650° C., preferably higher than or equal to 300° C. and lower than or equal to 400° C., further preferably higher than or equal to 320° C. and lower than or equal to 370° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By the heat treatment, impurities such as hydrogen and water can be removed from at least one of the oxide semiconductor layer 408 and the gate insulating layer 404. As described above, stable electrical characteristics can be effectively imparted to the transistor 300 in which an oxide semiconductor layer serves as a channel by reducing the concentration of impurities in the oxide semiconductor layer 408 to make the oxide semiconductor layer highly purified intrinsic or highly purified substantially intrinsic.

Next, a conductive film to be the source electrode layer 410a and the drain electrode layer 410b (including a wiring formed with the same layer) is formed over the oxide semiconductor layer 408, and is processed to form a source electrode layer 410a and a drain electrode layer 410b.

For the source electrode layer 410a and the drain electrode layer 410b, a conductive material which is easily bonded to oxygen can be preferably used. For example, Al, Cr, Cu, Ta, Ti, Mo, or W can be used. Tungsten (W) having a high melting point is especially preferred because a relatively high process temperature can be employed in a later step. Note that a conductive material which easily reacts with oxygen includes a material where oxygen is easily diffused.

When such a conductive material which is easily bonded to oxygen is in contact with the oxide semiconductor layer 408, oxygen in the oxide semiconductor layer 408 is taken into the conductive material. Some heating steps are performed in a manufacturing process of the transistor, and thus oxygen vacancies are generated in regions of the oxide semiconductor layer 408 which are in the vicinity of an interface between the oxide semiconductor layer 408 and each of the source electrode layer 410a and the drain electrode layer 410b, so that n-type regions are formed. The n-type regions can function as a source and a drain of the transistor 300.

Note that a constituent element of the source electrode layer 410a and the drain electrode layer 410b may enter the n-type regions. Further, a region having high oxygen concentration may be formed in part of the source electrode layer 410a and part of the drain electrode layer 410b, which are in contact with the n-type regions. A constituent element of the oxide semiconductor layer 408 may enter the source electrode layer 410a and the drain electrode layer 410b in contact with the n-type regions in some cases. That is, in the vicinity of the interface between the oxide semiconductor layer 408 and the source and drain electrode layers 410a and 410b, a portion which can be called a mixed region or a mixed layer of the two contacting layers is formed in some cases.

Next, an insulating layer 414 is formed over the oxide semiconductor layer 408, the source electrode layer 410a, and the drain electrode layer 410b. As the insulating layer 414, an oxide insulating layer is preferably used, for example, a silicon oxide layer, a silicon oxynitride layer, or an aluminum oxide layer is preferably used.

In the case where an oxide insulating layer is provided as the insulating layer 414, heat treatment is preferably performed after the formation of the insulating layer 414. By the heat treatment, part of oxygen contained in the insulating layer 414 that is the oxide insulating layer can be moved to the oxide semiconductor layer 408, so that oxygen can be supplied to oxygen vacancies in the oxide semiconductor layer 408. Consequently, the amount of oxygen vacancies in the oxide semiconductor layer 408 can be reduced. The heat treatment can be performed under conditions similar to those for the heat treatment performed after forming the oxide semiconductor film or processing into the island-shaped oxide semiconductor layer 408.

Alternatively, the insulating layer 414 may have a stacked structure. For example, a stacked structure of an oxide insulating layer in contact with the oxide semiconductor layer 408 and a nitride insulating layer over the oxide insulating layer may be used. As the nitride insulating layer, a silicon nitride layer, a silicon nitride oxide layer, or the like can be used.

In the above manner, the transistor 300 in this embodiment can be formed.

Figure 2A:
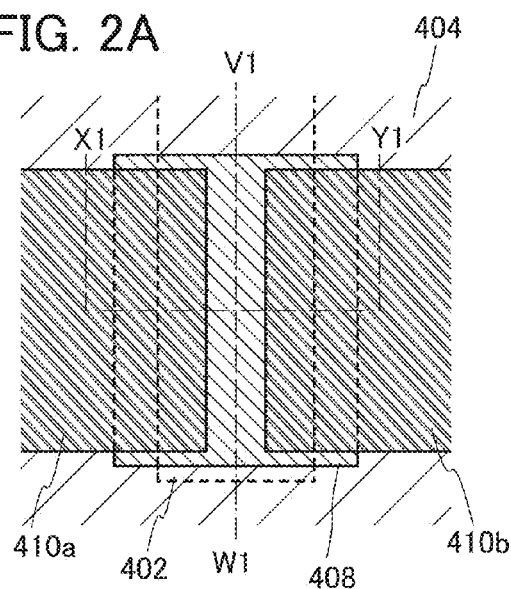
FIGS. 2A to 2C are cross-sectional views illustrating a semiconductor device of one embodiment of the present invention.
Figure 2C:
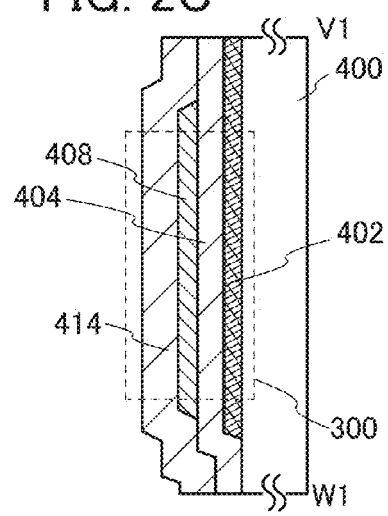
Figure 2B:
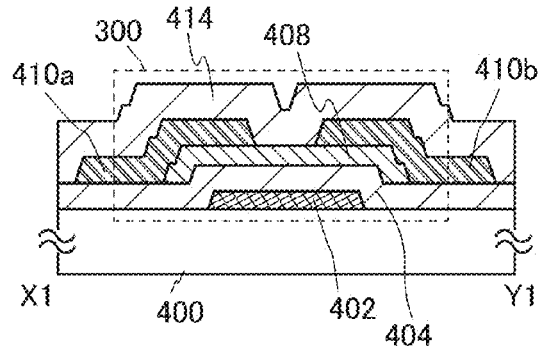

FIGS. 2A to 2C illustrate a structural example of a semiconductor device. FIG. 2A is a plan view of the transistor 300, FIG. 2B is a cross-sectional view taken along line X1-Y1 in FIG. 2A, and FIG. 2C is a cross-sectional view taken along line V1-W1 in FIG. 2A. Note that in FIG. 2A, some components (e.g., the insulating layer 414 and the like) are not illustrated to avoid complexity.

The transistor 300 illustrated in FIGS. 2A to 2C includes the gate electrode layer 402 over the substrate 400, the gate insulating layer 404 over the gate electrode layer 402, the oxide semiconductor layer 408 being over the gate insulating layer 404 and overlapping with the gate electrode layer 402, and the source electrode layer 410a and the drain electrode layer 410b electrically connected to the oxide semiconductor layer 408.

Note that the insulating layer 414 which is provided over the oxide semiconductor layer 408, the source electrode layer 410a, and the drain electrode layer 410b may be included in the transistor 300 as components. As the insulating layer 414 in contact with a region where a channel is formed in the oxide semiconductor layer 408, an insulating layer containing oxygen (oxide insulating layer), in other words, an insulating layer which can release oxygen, is preferably used. This is because oxygen is supplied from the insulating layer 414 which can release oxygen to the channel of the oxide semiconductor layer 408, whereby oxygen vacancies in the oxide semiconductor layer 408 or at an interface of the oxide semiconductor layer 408 can be reduced. Note that as the insulating layer capable of releasing oxygen, a silicon oxide layer, a silicon oxynitride layer, or an aluminum oxide layer can be used, for example.

In the region where the channel is formed in the oxide semiconductor layer 408, hydrogen is preferably reduced as much as possible. Specifically, in the oxide semiconductor layer 408, the hydrogen concentration which is measured by secondary ion mass spectrometry (SIMS) is set to $2\times10^{20}$ atoms/cm$^3$ or lower, preferably $5\times10^{19}$ atoms/cm$^3$ or lower, further preferably $1\times10^{19}$ atoms/cm$^3$ or lower, $5\times10^{18}$ atoms/cm$^3$ or lower, preferably $1\times10^{18}$ atoms/cm$^3$ or lower, preferably $5\times10^{17}$ atoms/cm$^3$ or lower, preferably $1\times10^{16}$ atoms/cm$^3$ or lower.

The oxide semiconductor layer 408 in which oxygen vacancies are reduced and hydrogen is reduced can be referred to as a highly purified intrinsic or highly purified substantially intrinsic oxide semiconductor layer. A highly purified intrinsic or substantially highly purified intrinsic oxide semiconductor has few carrier generation sources, and thus has a low carrier density in some cases. The highly purified intrinsic or highly purified substantially intrinsic oxide semiconductor layer has a low density of defect states, which are factors of a donor, and accordingly can have a low density of trap states.

Further, the highly purified intrinsic or highly purified substantially intrinsic oxide semiconductor layer 408 has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Further, with use of a manufacturing apparatus, power is adjusted to be applied to the entire surface of the substrate uniformly during film deposition, whereby an oxide semiconductor film the thickness uniformity of which is less than ±3%, preferably less than or equal to ±2% can be formed.

Thus, the transistor 300 whose channel region is formed in the oxide semiconductor layer 408 has a small variation in electrical characteristics and high reliability.

This embodiment is described with a transistor with a bottom-gate structure (bottom-gate transistor). However, this embodiment is not limited to the above, and this embodiment can be applied to a transistor with a top-gate structure in which a gate electrode is provided over an oxide semiconductor film, a transistor with a dual-gate structure (dual-gate transistor) in which gate electrodes are provided over and below the oxide semiconductor film, or the like. In addition, this embodiment can be applied to a channel protective transistor.

Figure 3A:
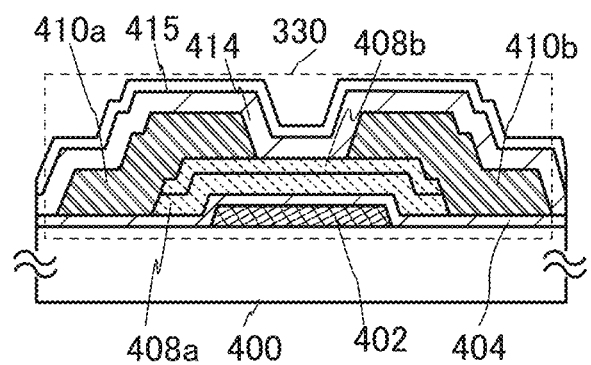
FIGS. 3A and 3B are cross-sectional views illustrating semiconductor devices of one embodiment of the present invention.

For example, a bottom-gate transistor 330 in which oxide semiconductor films are stacked as illustrated in FIG. 3A may be employed. As the oxide semiconductor film, a first oxide semiconductor film 408a and a second oxide semiconductor film 408b are stacked. Each of the oxide semiconductor films has the thickness uniformity that is less than ±3%, preferably less than or equal to ±2%. Furthermore, a protective film 415 is provided over the oxide insulating layer 414. As the protective film 415, a nitride insulating layer such as a silicon nitride layer or a silicon nitride oxide layer is used.

Figure 3B:
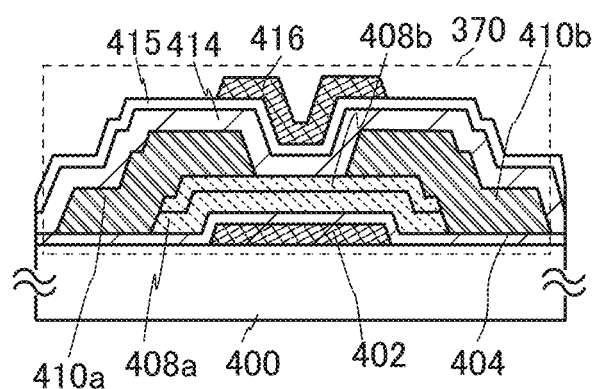

An example of a dual-gate transistor 370 is illustrated in FIG. 3B. In the dual-gate transistor 370, the first oxide semiconductor film 408a and the second oxide semiconductor film 408b are stacked as the oxide semiconductor film. Each of the oxide semiconductor films has the thickness uniformity that is less than ±3%, preferably less than or equal to ±2%. Further, it is preferable that a gate electrode 416 provided over the oxide semiconductor film be electrically connected to the gate electrode layer 402 provided below the oxide semiconductor film and have the same potential as the gate electrode layer 402.

Embodiment 2

In this embodiment, an example of a manufacturing apparatus used for forming an oxide semiconductor film having the thickness uniformity that is less than ±3% will be described with FIGS. 4A to 4C.

Figure 4A:
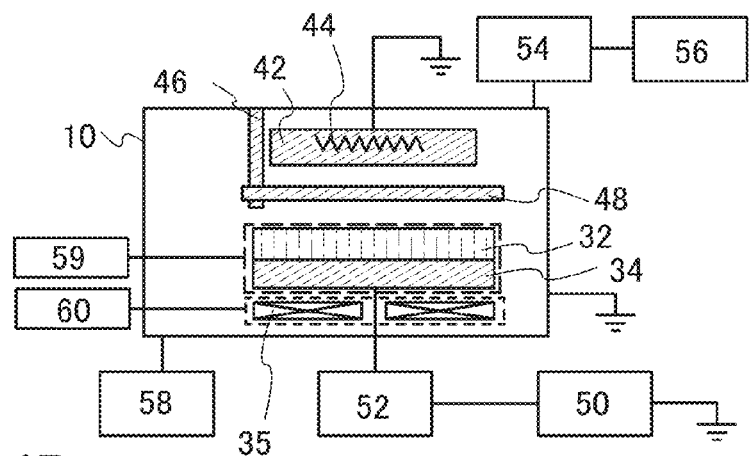
FIG. 4A is a cross-sectional view of a manufacturing apparatus of one embodiment of the present invention.

FIG. 4A illustrates an example of a deposition chamber. A deposition chamber 10 illustrated in FIG. 4A is called a magnetron sputtering apparatus. With use of this apparatus, an increase in deposition rate, a reduction in plasma damage on a substrate, and an improvement in film quality can be achieved.

The deposition chamber 10 includes a target 32, a target holder 34 supporting the target, a device 59 that swings the target holder 34, a magnets 35a to 35d provided inside or below the target holder 34, a device 60 that swings the magnets 35a to 35d, an RF power source 50 that supplies power to the target holder 34 through a matching box 52, a substrate holder 42 in which a substrate heater 44 is embedded and which supports a substrate 40, a shutter plate 48 that can rotate around a shutter axis 46 as an axis, a deposition gas supply source 56 that supplies a deposition gas, a refiner 54 provided between the deposition gas supply source 56 and the deposition chamber 10, and a vacuum pump 58 connected to the deposition chamber 10. It is preferable to provide the magnets 35a to 35d inside or below the target holder 34 because high-density plasma can be confined on the periphery of the target. Here, the deposition chamber 10, the RF power source 50, the shutter axis 46, the shutter plate 48, and the substrate holder 42 are connected to GND. Note that one or more of the deposition chamber 10, the shutter axis 46, the shutter plate 48, and the substrate holder 42 may be in a floating state depending on the use.

In the case where a comparatively large glass substrate is used as the substrate 40, a plurality of sputtering targets that are arranged are used because there is a limitation on a size of a metal oxide sputtering target for manufacturing ability.

Figure 4B:
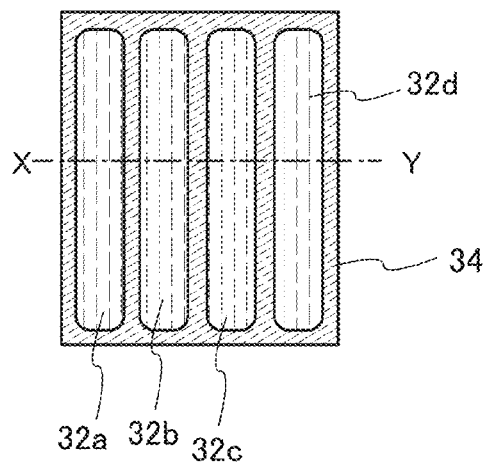
FIG. 4B is a schematic diagram illustrating an example of arrangement of sputtering targets and a target holder.

FIG. 4B illustrates an example in which four target groups are provided on one target holder 34.

Each of target groups 32a, 32b, 32c, and 32d is composed of a plurality of metal oxide sputtering targets. For example, one target group includes three sputtering targets; that is, the four sputtering groups are composed of 12 parts of sputtering targets in total.

Figure 4C:
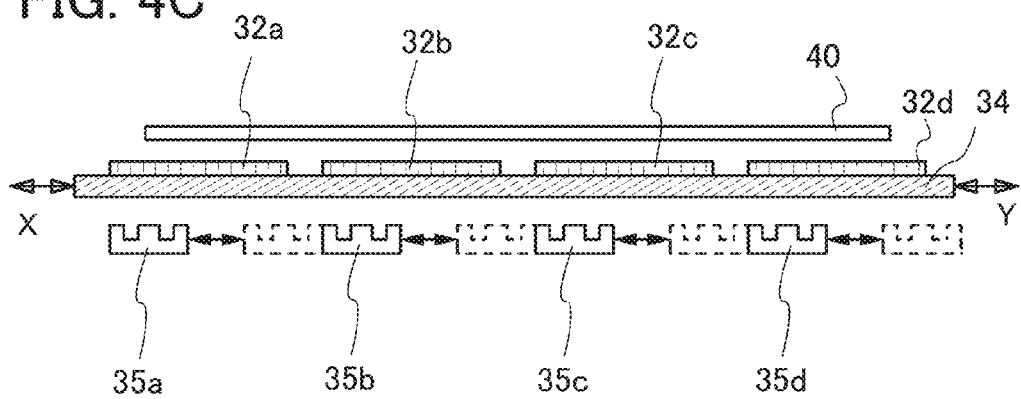
FIG. 4C is a schematic diagram illustrating an example of arrangement of magnets and sputtering targets.

FIG. 4C partly illustrates a cross section of the deposition chamber in a state where the substrate is located and part of the sputtering apparatus is swung during film deposition. Note that FIG. 4C is a schematic view taken along chain line X-Y in FIG. 4B.

In an example illustrated in FIG. 4C, both the magnets 35a to 35d and the target holder 34 are swung. Here, the sentence "part of the sputtering apparatus is swung" means that one of or both the magnets 35a to 35d and the target holder 34 are moved up and down, moved from side to side, or rotated. For example, the operation in which the magnet is moved at a frequency or a cycle greater than or equal to 0.1 Hz and less than or equal to 1 kHz is called swing.

For example, a member other than a material of the target is provided between the target group 32a and the target group 32b so as not to exist an empty space. The target does not exist in the portion where the member is provided; thus, the thickness of a film deposited on the substrate corresponding to the portion where the target is not provided might be thin.

The magnets 35a to 35d are swung by the device 60 that swings the magnets 35a to 35d, and the target holder 34 is swung by the device that swings the target holder 34. The magnets 35a to 35d and the target holder 34 are swung independently, which makes an uniform plasma space to be formed between the target groups, and thus the plasma density can be uniformed.

Further, the number of the vacuum pumps 58 is not limited to one. A plurality of vacuum pumps 58 may be provided. For example, a rough vacuum pump and a high vacuum pump may be connected in series or in parallel. Further, the number of the gas supply sources 56 and the number of the refiners 54 may each be plural. For example, the number of combinations of the deposition gas supply source and the refiner can be increased depending on the number of kinds of deposition gases. A plurality of combinations of the deposition gas supply sources and the refiners may be directly connected to the disposition chamber 10. In that case, a mass flow controller that adjusts the flow rate of deposition gas may be provided between the deposition chamber 10 and each refiner. Alternatively, the plurality of combinations of the deposition gas supply sources and the refiners may be connected to a pipe jointing the deposition chamber 10 and the refiners 54.

Although the RF power source is used as a sputtering power source here, a power source of the present invention is not necessarily limited to an RF power source. A DC power source, an AC power source, or two kinds or more power sources between which switching can be performed may be provided depending on the use. In the case where a DC power source or an AC power source is used, the matching box between the power source and the target holder is not necessary. The substrate holder 42 needs to be provided with a chuck system for supporting a substrate. As the chuck system, an electrostatic chuck system, a clamp system, and the like can be given. Note that in the case where the substrate size is not too large and there is no concern for cracking the substrate, a rotating mechanism may be provided for the substrate holder to increase the uniformity of the film quality and film thickness on the substrate.

Further, a plurality of substrate holders may be provided in the deposition chamber so that film deposition on a plurality of substrates can be performed simultaneously. Furthermore, a structure may be employed in which the shutter axis 46 or the shutter plate 48 are not provided. FIG. 4A shows the structure in which the target is provided below the substrate; however, the target may be provided over the substrate or provided aside the substrate.

The leakage rate of the deposition chamber 10 is preferably less than or equal to $1 \times 10^{-10}$ Pa·m³/sec. Specifically, with a leakage rate of the deposition chamber less than or equal to $1 \times 10^{-10}$ Pa·m³/sec, the hydrogen entering a film during film deposition can be reduced.

The leakage is broadly classified into external leakage and internal leakage. The external leakage refers to inflow of a gas from the outside of a vacuum system through a minute hole, a sealing defect, or the like. The internal leakage is due to leakage through a partition, such as a valve, in a vacuum system or due to a released gas from an internal member. Measures need to be taken from both aspects of external leakage and internal leakage in order that the leakage rate be less than or equal to $1 \times 10^{-10}$ Pa·m³/sec.

For example, an open/close portion of the deposition chamber is preferably sealed with a metal gasket. For the metal gasket, a metal material covered with iron fluoride, aluminum oxide, or chromium oxide is preferably used. The metal gasket enables higher adhesion than an O-ring, leading to a reduction in the external leakage. Further, by use of a metal material covered with iron fluoride, aluminum oxide, chromium oxide, or the like which is in the passive state, released gas containing hydrogen generated from the metal gasket is suppressed, so that the internal leakage can be reduced.

As a member forming the deposition apparatus, aluminum, chromium, titanium, zirconium, nickel, or vanadium, from which the released gas containing hydrogen is in a smaller amount, is used. An alloy material containing iron, chromium, nickel, or the like covered with the above-mentioned material may also be used. The alloy material containing iron, chromium, nickel, or the like is rigid, resistant to heat, and suitable for processing. Here, when surface unevenness of the member is decreased by polishing or the like to reduce the surface roughness, the release of gas can be reduced.

Alternatively, the above member of the deposition apparatus may be covered with iron fluoride, aluminum oxide, chromium oxide, or the like.

The member of the deposition apparatus is preferably formed using only a metal material when possible. For example, in the case where a viewing window formed using quartz or the like is provided, a surface is preferably covered thinly with iron fluoride, aluminum oxide, chromium oxide, or the like to suppress the release of gas.

Here, the gas refiner may be provided just in front of the film formation gas may be introduced. In this case, the length of a pipe between the gas purifier and the deposition chamber is less than or equal to 5 m, preferably less than or equal to 1 m. When the length of the pipe is less than or equal to 5 m or less than or equal to 1 m, the effect of the release of gas from the pipe can be reduced accordingly.

As the pipe for the deposition gas, a metal pipe the inside of which is covered with iron fluoride, aluminum oxide, chromium oxide, or the like is preferably used. With the above-mentioned pipe, the amount of released gas containing hydrogen is small and entry of impurities into the film formation gas can be reduced as compared with a SUS316L-EP pipe, for example. Further, a high-performance ultra-compact metal gasket joint (UPG joint) is preferably used as a joint of the pipe. In addition, a structure where all the materials of the pipe are metal materials is preferable, in which the effect of the generated released gas or the external leakage can be reduced as compared to the structure where resin or the like is used.

Evacuation of the deposition chamber is preferably performed with a rough vacuum pump, such as a dry pump, and a high vacuum pump, such as a sputter ion pump, a turbo molecular pump, or a cryopump, in appropriate combination. A turbo molecular pump has an outstanding capability in removing a large-sized molecule, whereas it has a low capability in removing hydrogen or water. Further, a combination with a cryopump having high capability in evacuating water or a sputter ion pump having high capability in evacuating hydrogen is effective.

When an adsorbate is present in the deposition chamber, the adsorbate does not affect the pressure in the deposition chamber because it is adsorbed onto an inner wall or the like; however, the adsorbate causes a release of gas when the inside of the deposition chamber is evacuated. Therefore, although there is no correlation between the leakage rate and the evacuation rate, it is important that the adsorbate present in the deposition chamber be desorbed as much as possible and evacuation be performed in advance with use of a pump with high evacuation capability. Note that the deposition chamber may be baked to promote desorption of the adsorbate. By the baking, the deposition rate of the adsorbate can be increased approximately tenfold. The baking can be performed at a temperature in the range of 100° C. to 450° C. At this time, when the adsorbate is removed while an inert gas is introduced, the rate of desorption of water or the like, which is difficult to desorb only by evacuation, can be further increased.

When the device 60 that swings the magnet and the device 59 that swings the target holder are independently activated during film deposition with use of the deposition apparatus illustrated in FIG. 4A, a difference between the uniformity of film thickness in the lateral direction of the substrate and the uniformity of film thickness in the longitudinal direction of the substrate can be reduced. Thus, the thickness uniformity of the oxide semiconductor to be formed can be less than ±3%.

Embodiment 3

An example of a single wafer multi-chamber deposition apparatus (manufacturing apparatus) including at least one deposition chamber described in Embodiment 2 will be described with reference to FIG. 5 and FIGS. 6A to 6C.

Figure 5:
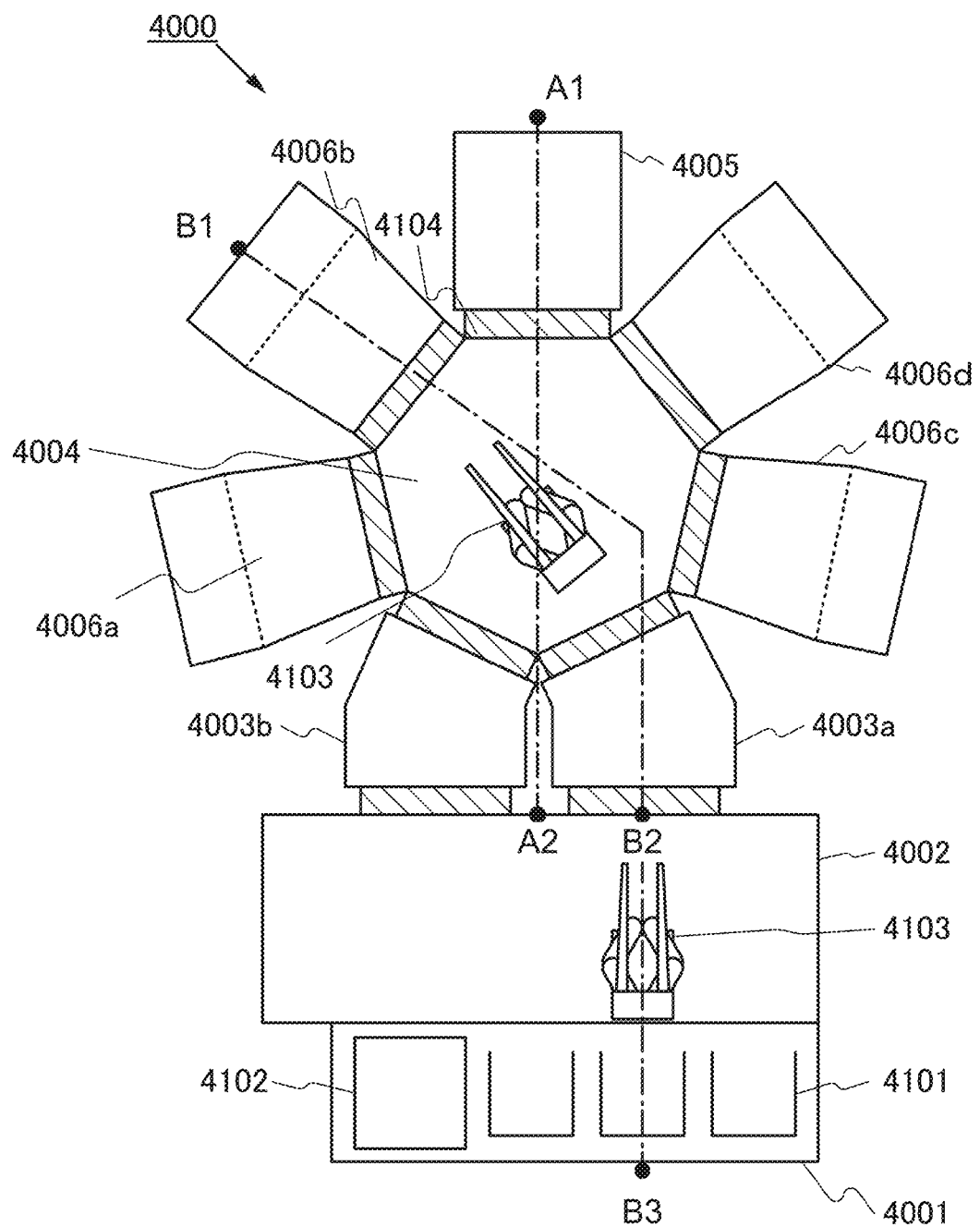
FIG. 5 is a top view illustrating a manufacturing apparatus of one embodiment of the present invention.

FIG. 5 is a top view schematically illustrating a single wafer multi-chamber deposition apparatus 4000. The deposition apparatus 4000 includes an atmosphere-side substrate supply chamber 4001 including a cassette port 4101 for storing substrates and an alignment port 4102 for performing alignment of substrates, an atmosphere-side substrate transfer chamber 4002 through which a substrate is transferred from the atmosphere-side substrate supply chamber 4001, a load lock chamber 4003a where a substrate is carried in and the pressure is switched from atmospheric pressure to reduced pressure or from reduced pressure to atmospheric pressure, an unload lock chamber 4003b where a substrate is carried out and the pressure is switched from reduced pressure to atmospheric pressure or from atmospheric pressure to reduced pressure, a transfer chamber 4004 where a substrate is transferred in a vacuum, a substrate heating chamber 4005 where a substrate is heated, and deposition chambers 4006*a*, 4006*b*, 4006*c*, and 4006*d* in each of which a sputtering target is placed for deposition.

Note that a plurality of the cassette ports 4101 may be provided as illustrated in FIG. 5 (in FIG. 5, three cassette ports 4101 are provided).

The atmosphere-side substrate transfer chamber 4002 is connected to the load lock chamber 4003*a* and the unload lock chamber 4003*b*, the load lock chamber 4003*a* and the unload lock chamber 4003*b* are connected to the transfer chamber 4004, and the transfer chamber 4004 is connected to the substrate heating chamber 4005 and the deposition chambers 4006*a*, 4006*b*, 4006*c*, and 4006*d*.

Gate valves 4104 are provided for connecting portions between chambers so that each chamber except the atmosphere-side substrate supply chamber 4001 and the atmosphere-side substrate transfer chamber 4002 can be independently kept under vacuum. In each of the atmosphere-side substrate supply chamber 4002 and the transfer chamber 4004, a substrate transfer robot 4103 is provided, which is capable of transferring glass substrates.

Further, it is preferable that the substrate heating chamber 4005 also serve as a plasma treatment chamber. In the deposition apparatus 4000, it is possible to transfer a substrate without exposure to the air between treatment and treatment; therefore, adsorption of impurities on a substrate can be suppressed. In addition, the order of film deposition, heat treatment, and the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 6A:
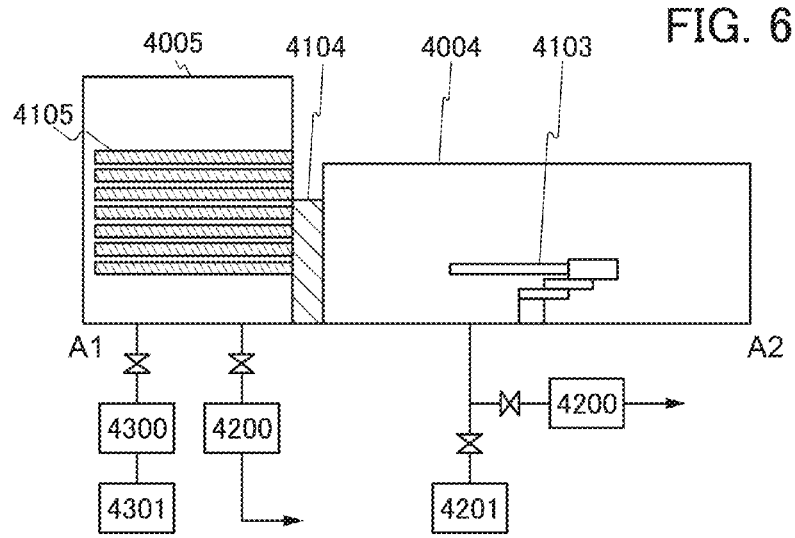
FIGS. 6A to 6C are cross-sectional views illustrating a manufacturing apparatus of one embodiment of the present invention.
Figure 6B:
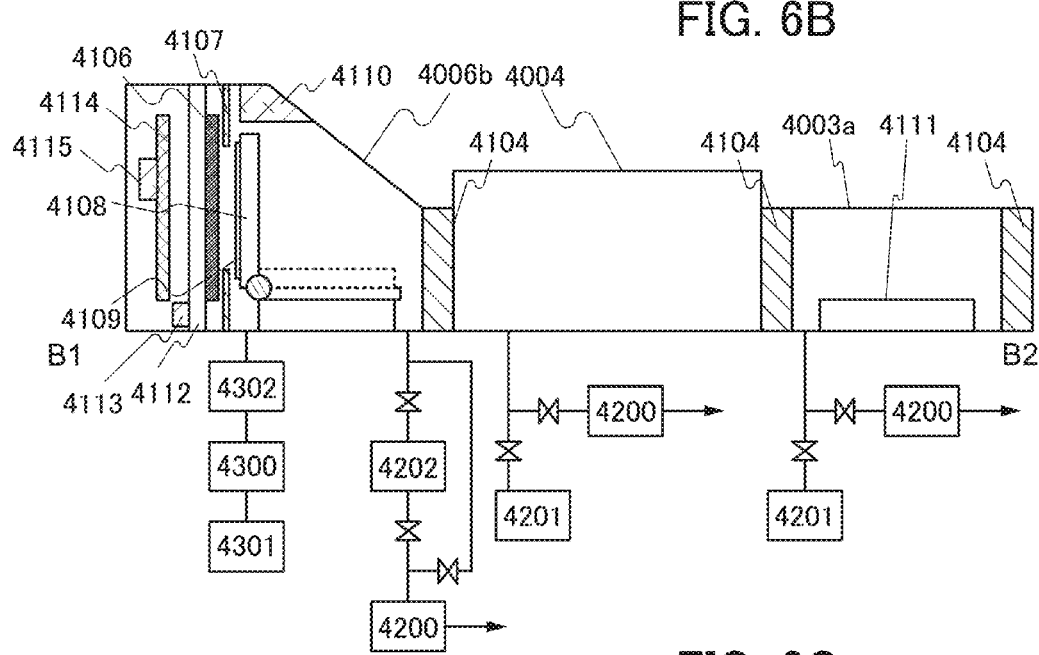
Figure 6C:
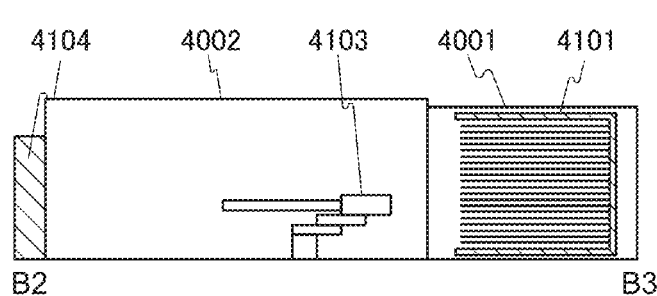

FIG. 6A, FIG. 6B, and FIG. 6C are a cross-sectional view taken along dashed-dotted line A1-A2, a cross-sectional view taken along dashed-dotted line B1-B2, and a cross-sectional view taken along dashed-dotted line B2-B3, respectively, in the deposition apparatus 4000 illustrated in FIG. 5.

FIG. 6A is a cross section of the substrate heating chamber 4005 and the transfer chamber 4004, and the substrate heating chamber 4005 includes a plurality of heating stages 4105 which can hold a substrate. Note that although the substrate heating chamber 4005 including the seven heating stages 4105 is illustrated in FIG. 6A, one embodiment of the present invention is not limited to such a structure. The number of heating stages 4105 may be greater than or equal to one and less than seven. Alternatively, the number of heating stages 4105 may be greater than or equal to eight. It is preferable to increase the number of the heating stages 4105 because a plurality of substrates can be subjected to heat treatment at the same time, which leads to an increase in productivity. Further, the substrate heating chamber 4005 is connected to a vacuum pump 4200 through a valve. As the vacuum pump 4200, a dry pump and a mechanical booster pump can be used, for example.

As a heating mechanism which can be used for the substrate heating chamber 4005, a resistance heater or the like may be used for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas.

Moreover, the substrate heating chamber 4005 is connected to a refiner 4301 through a mass flow controller 4300. Note that although the mass flow controller 4300 and the refiner 4301 can be provided for each of a plurality of kinds of gases, only one mass flow controller 4300 and one refiner 4301 are provided for simplicity. As the gas introduced to the substrate heating chamber 4005, a gas whose dew point is −80° C. or lower, preferably −100° C. or lower can be used; for example, an oxygen gas, a nitrogen gas, and a rare gas (e.g., an argon gas) are used.

The transfer chamber 4004 includes the substrate transfer robot 4103. The substrate transfer robot 4103 includes a plurality of movable portions and an arm for holding a substrate and can transfer a substrate to each chamber. Further, the transfer chamber 4004 is connected to a vacuum pump 4200 and a cryopump 4201 through valves. With such a structure, the transfer chamber 4004 is evacuated from the atmospheric pressure to a low or medium vacuum (about 0.1 Pa to several hundred pascals) by using the vacuum pump 4200 and then evacuated from the medium vacuum to a high or ultrahigh vacuum (0.1 Pa to $1 \times 10^{-7}$ Pa) by switching between the valves and using the cryopump 4201.

Alternatively, two or more cryopumps 4201 may be connected in parallel to the transfer chamber 4004. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 6B shows a cross section of the deposition chamber 4006*b*, the transfer chamber 4004, and the load lock chamber 4003*a*.

Here, the details of the deposition chamber (sputtering chamber) are described with reference to FIG. 6B. The deposition chamber 4006*b* illustrated in FIG. 6B includes a target 4106, a target holder 4112, a device 4113 that swings the target holder, a magnet 4114, a device 4115 that swings the magnet, an attachment protection plate 4107, and a substrate stage 4108. Note that here, a glass substrate 4109 is provided on the substrate stage 4108. Although not illustrated, the substrate stage 4108 may include a substrate holding mechanism which holds the glass substrate 4109, a rear heater which heats the glass substrate 4109 from the back surface, or the like.

The direction where the magnet 4114 is swung by the device 4115 is perpendicular to the paper. The direction where the target and the target holder are swung by the device 4113 is also perpendicular to the paper.

A shape of the magnet 4114 when seen in the direction toward the substrate surface is a stick form, and a cross-section thereof has the shape illustrated in FIG. 4C in Embodiment 2. Further, in the case where a plurality of targets 4106 are arranged as in the case of FIG. 4B, one magnet 4114 may be provided for one target group. In the case where four target groups are provided, four magnets are provided in total.

FIG. 6B shows an example in which the device 4113 that swings the target holder is provided on the magnet 4114 side; however, the position of the device 4113 is not particularly limited thereto, and the device 4113 may be provided on the substrate side. In addition, there is no limitation on the position of the device 4115 that swings the magnet. The device 4115 can be provided in any portion as long as the plasma density can be uniformed. The device 4113 that swings the target holder and the device 4115 that swings the magnet are independently swung, whereby a uniform plasma space is formed between the target groups, and the plasma density can be uniformed. Thus, with use of the deposition chamber 4006b for film deposition, an oxide semiconductor film the thickness uniformity of which is less than ±3%, preferably less than or equal to ±2% is formed.

Note that the substrate stage 4108 is held substantially perpendicularly to a floor during film deposition and is held substantially parallel to the floor when the substrate is delivered. In FIG. 6B, the position where the substrate stage 4108 is held when the substrate is delivered is denoted by a dashed line. With such a structure, the probability that dust or a particle which might be mixed into the film during deposition is attached to the glass substrate 4109 can be lowered as compared to the case where the substrate stage 4108 is held parallel to the floor. However, there is a possibility that the glass substrate 4109 falls when the substrate stage 4108 is held vertically (90°) to the floor; therefore, the angle of the substrate stage 4108 to the floor is preferred to be greater than or equal to 80° and lower than 90°.

The attachment protection plate 4107 can suppress deposition of a particle which is sputtered from the target 4106 on a region where deposition is not needed. Moreover, the attachment protection plate 4107 is preferably processed to prevent accumulated sputtered particles from being separated. For example, blasting treatment which increases surface roughness may be performed, or roughness may be formed on the surface of the attachment protection plate 4107.

The film formation chamber 4006b is connected to the mass flow controller 4300 through a gas heating system 4302, and the gas heating system 4302 is connected to the refiner 4301 through the mass flow controller 4300. With the gas heating system 4302, a gas to be introduced to the deposition chamber 4006b can be heated to a temperature higher than or equal to 40° C. and lower than or equal to 400° C., preferably higher than or equal to 50° C. and lower than or equal to 200° C. Note that although the gas heating system 4302, the mass flow controller 4300, and the refiner 4301 can be provided for each of a plurality of kinds of gases, only one gas heating system 4302, one mass flow controller 4300, and one refiner 4301 are provided for simplicity. As the gas introduced to the deposition chamber 4006b, a gas whose dew point is −80° C. or lower, preferably −100° C. or lower can be used; for example, an oxygen gas, a nitrogen gas, and a rare gas (e.g., an argon gas) are used.

The deposition chamber 4006b is connected to a turbo molecular pump 4202 and a vacuum pump 4200 through valves.

In addition, the deposition chamber 4006b is provided with a cryotrap 4110.

The cryotrap 4110 is a mechanism which can adsorb a molecule (or an atom) having a relatively high melting point, such as water. The turbo molecular pump 4202 is capable of stably evacuating a large-sized molecule (or atom), needs low frequency of maintenance, and thus enables high productivity, whereas it has a low capability in evacuating hydrogen and water. Hence, the cryotrap 4110 is connected to the deposition chamber 4006b so as to have a high capability in evacuating water or the like. The temperature of a refrigerator of the cryotrap 4110 is set to be lower than or equal to 100 K, preferably lower than or equal to 80 K. In the case where the cryotrap 4110 includes a plurality of refrigerators, it is preferable to set the temperature of each refrigerator at a different temperature because efficient evacuation is possible. For example, the temperatures of a first-stage refrigerator and a second-stage refrigerator may be set at 100 K or lower and 20 K or lower, respectively.

Note that the evacuation method of the deposition chamber 4006b is not limited to the above, and a structure similar to that in the evacuation method described in the transfer chamber 4004 (the evacuation method using the cryopump and the vacuum pump) may be employed. Needless to say, the evacuation method of the transfer chamber 4004 may have a structure similar to that of the deposition chamber 4006b (the evacuation method using the turbo molecular pump and the vacuum pump).

Note that in each of the above transfer chamber 4004, the substrate heating chamber 4005, and the deposition chamber 4006b, the back pressure (total pressure) and the partial pressure of each gas molecule (atom) are preferably set as follows. In particular, the back pressure and the partial pressure of each gas molecule (atom) in the deposition chamber 4006b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, further preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, further preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, further preferably less than or equal to $3 \times 10^{-6}$ Pa. Further, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, further preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. can be used.

Moreover, the above transfer chamber 4004, the substrate heating chamber 4005, and the deposition chamber 4006b preferably have a small amount of external leakage or internal leakage.

For example, in each of the above transfer chamber 4004, the substrate heating chamber 4005, and the deposition chamber 4006b, the leakage rate is less than or equal to $3 \times 10^{-6}$ Pa·m$^3$/s, preferably less than or equal to $1 \times 10^{-6}$ Pa·m$^3$/s. The leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. The leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. The leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

For example, an open/close portion of the deposition chamber 4006b can be sealed with a metal gasket. For the metal gasket, metal covered with an iron fluoride, an aluminum oxide, or a chromium oxide is preferably used. The metal gasket enables higher adhesion than an O-ring, leading to a reduction in the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus 4000, aluminum, chromium, titanium, zirconium, nickel, or vanadium, which releases a smaller amount of gas containing impurities, is used.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, although there is no correlation between the leakage rate and the evacuation rate, it is important that the adsorbate present in the deposition chamber be desorbed as much as possible and evacuation be performed in advance with use of a pump with high evacuation capability. Note that the deposition chamber may be baked to promote desorption of the adsorbate. By the baking, the deposition rate of the adsorbate can be increased approximately tenfold. The baking can be performed at a temperature in the range of 100° C. to 450° C. At this time, when the adsorbate is removed while an inert gas is introduced to the deposition chamber, the desorption rate of water or the like, which is difficult to be desorbed simply by evacuation, can be further increased. Note that when the inert gas to be introduced is heated to substantially the same temperature as the baking temperature of the deposition chamber, the desorption rate of the adsorbate can be further increased. Here, a rare gas is preferably used as an inert gas. Depending on the kind of a film to be formed, oxygen or the like may be used instead of an inert gas. For example, in the case of forming an oxide semiconductor layer, using oxygen, which is the main component of the oxide, is preferable in some cases.

Next, the details of the transfer chamber 4004 and the load lock chamber 4003a illustrated in FIG. 6B and the atmosphere-side substrate transfer chamber 4002 and the atmosphere-side substrate supply chamber 4001 illustrated in FIG. 6C are described. Note that FIG. 6C is a cross section of the atmosphere-side substrate transfer chamber 4002 and the atmosphere-side substrate supply chamber 4001.

For the transfer chamber 4004 illustrated in FIG. 6B, the description of the transfer chamber 4004 in FIG. 6A can be referred to; thus, the description thereof is skipped here.

The load lock chamber 4003a includes a substrate delivery stage 4111. When a pressure in the load lock chamber 4003a becomes an atmospheric pressure by being increased from a reduced pressure, the substrate delivery stage 4111 receives a substrate from the substrate transfer robot 4103 provided in the atmosphere-side substrate transfer chamber 4002. After that, the load lock chamber 4003a is evacuated into vacuum so that the pressure therein becomes a reduced pressure and then the substrate transfer robot 4103 provided in the transfer chamber 4004 receives the substrate from the substrate delivery stage 4111.

Further, the load lock chamber 4003a is connected to a vacuum pump 4200 and a cryopump 4201 through valves. For a method for connecting evacuation systems such as the vacuum pump 4200 and the cryopump 4201, the description of the method for connecting the transfer chamber 4004 can be referred to, and the description thereof is omitted here. Note that the unload lock chamber 4003b illustrated in FIG. 5 can have a structure similar to that in the load lock chamber 4003a.

The atmosphere-side substrate transfer chamber 4002 includes the substrate transfer robot 4103. The substrate transfer robot 4103 can deliver a substrate from the cassette port 4101 to the load lock chamber 4003a or deliver a substrate from the load lock chamber 4003a to the cassette port 4101. Further, a mechanism for cleaning dust or a particle, such as high efficiency particulate air (HEPA) filter, may be provided above the atmosphere-side substrate transfer chamber 4002 and the atmosphere-side substrate supply chamber 4001.

The atmosphere-side substrate supply chamber 4001 includes a plurality of the cassette ports 4101. The cassette port 4101 can hold a plurality of substrates.

With use of the above deposition apparatus, an oxide semiconductor film the thickness uniformity of which is less than ±3% is formed, whereby a manufacturing apparatus with which a semiconductor device having stable electrical characteristics and high reliability can be manufactured can be obtained.

Although an example of a single wafer multi-chamber deposition apparatus (manufacturing apparatus) is described in this embodiment, a manufacturing apparatus is not limited to the above. It is needless to say that an in-line manufacturing apparatus in which a plurality of deposition apparatuses are arranged in one line can be used. When an in-line manufacturing apparatus is used, a manufacturing apparatus that enables mass production of highly reliable semiconductor devices with use of a large-sized substrate such as a mother glass can be provided.

Embodiment 4

In this embodiment, an example in which at least part of a driver circuit and a transistor to be disposed in a pixel portion are formed over one substrate will be described below.

The transistor in the pixel portion is formed in accordance with Embodiment 1. Further, the transistor can easily be an n-channel transistor, and thus, part of a driver circuit that can be formed using an n-channel transistor is formed over the same substrate as the transistor in the pixel portion. When the deposition apparatus and the manufacturing apparatus described in the above embodiment are used to form an oxide semiconductor film the thickness uniformity of which is less than ±3% in the pixel portion or the driver circuit, transistors with less variation in electrical characteristics can be manufactured, and thus a display device with high display quality can be provided.

Figure 7A:
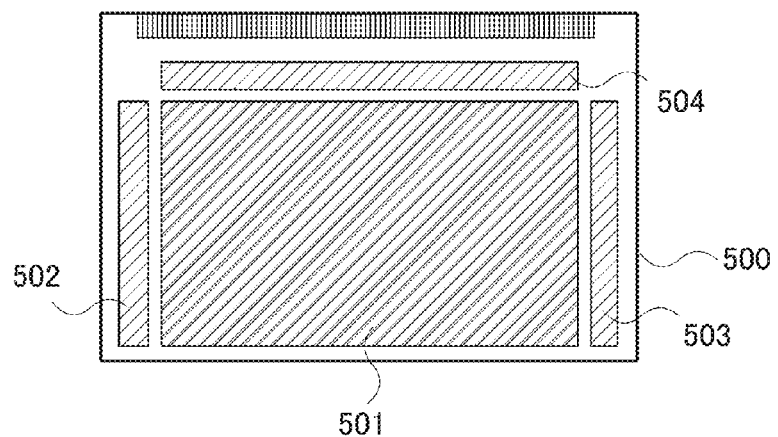
FIGS. 7A to 7C are a block diagram and equivalent circuit diagrams illustrating one embodiment of the present invention.

FIG. 7A illustrates an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels each including a display element are provided in matrix in respective regions in each of which the scan line and the signal line intersect with each other. The substrate 500 of the display device is connected to a timing control circuit (also referred to as a controller or a control IC) through a connection portion such as a flexible printed circuit (FPC).

In FIG. 7A, the first scan line driver circuit 502, the second scan line driver circuit 503, and the signal line driver circuit 504 are formed over the same substrate 500 as the pixel portion 501. Accordingly, the number of components such as a driver circuit provided outside are reduced, so that a reduction in cost can be achieved. Further, if the driver circuit is provided outside the substrate 500, wiring would need to be extended and the number of wiring connections would be increased, but if the driver circuit is provided over the substrate 500, the number of wiring connections can be reduced. Accordingly, the reliability or yield can be improved.

Figure 7B:
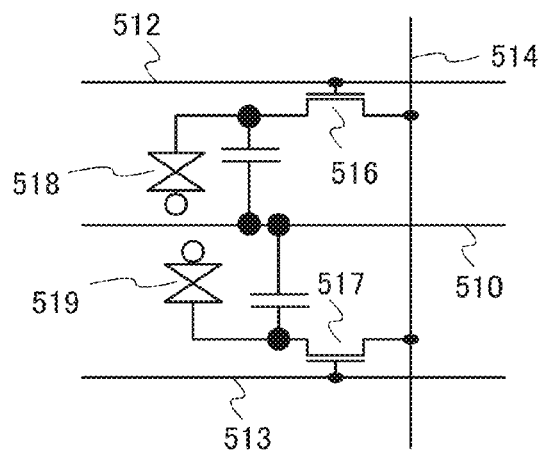

FIG. 7B shows an example of a circuit configuration of the pixel portion. Here, a pixel structure of a VA liquid crystal display panel is illustrated.

In this pixel structure, a plurality of pixel electrode layers are provided in one pixel, and transistors are connected to respective pixel electrode layers. The plurality of transistors are constructed so as to be driven by different gate signals. In other words, signals applied to individual pixel electrode layers in a multi-domain pixel are controlled independently.

A gate wiring 512 of a transistor 516 and a gate wiring 513 of a transistor 517 are separated so that different gate signals can be given thereto. In contrast, a source or drain electrode layer 514 functioning as a data line is used in common for the transistors 516 and 517. As the transistors 516 and 517, the transistor described in the above embodiment can be used as appropriate. When the deposition apparatus and the manufacturing apparatus described in the above embodiment are used to form an oxide semiconductor film the thickness uniformity of which is less than ±3% in a transistor, the transistor with less variation in electrical characteristics can be manufactured, and a liquid crystal display device with high display quality can be provided.

A first pixel electrode layer electrically connected to the transistor 516 and a second pixel electrode layer electrically connected to the transistor 517 have different shapes and are separated by a slit. The second pixel electrode layer is provided so as to surround the external side of the first pixel electrode layer which is spread in a V shape. Timing of voltage application is made to vary between the first and second pixel electrode layers by the transistors 516 and 517 in order to control alignment of the liquid crystal. The transistor 516 is connected to the gate wiring 512, and the transistor 517 is connected to the gate wiring 513. When different gate signals are supplied to the gate wiring 512 and the gate wiring 513, operation timings of the transistor 516 and the transistor 517 can be varied.

Further, a storage capacitor is formed using a capacitor wiring 510, a gate insulating film functioning as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 518. In addition, the second pixel electrode layer, the liquid crystal layer, and the counter electrode layer overlap with each other to form a second liquid crystal element 519. The pixel structure is a multi-domain structure in which the first liquid crystal element 518 and the second liquid crystal element 519 are provided in one pixel.

Note that the pixel structure is not limited to that illustrated in FIG. 7B. For example, a switch, a resistor, a capacitor, a transistor, a sensor, a logic circuit, or the like may be added to the pixel illustrated in FIG. 7B.

Figure 7C:
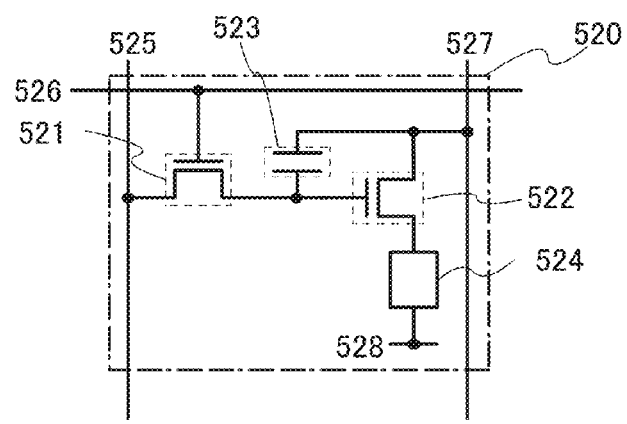

FIG. 7C shows an example of a circuit configuration of the pixel portion. Here, a pixel structure of a display panel using an organic EL element is illustrated.

In an organic EL element, by application of a voltage to a light-emitting element, electrons and holes are separately injected from a pair of electrodes into a layer containing a light-emitting organic compound, and a current flows. The electrons and holes (i.e., carriers) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

FIG. 7C illustrates an example of a pixel structure to which digital time grayscale driving can be applied, as an example of a semiconductor device.

A structure and an operation of a pixel to which digital time ratio grayscale driving can be applied is described. Here, one pixel includes two n-channel transistors each of which includes an oxide semiconductor layer as a channel formation region.

A pixel 520 includes a switching transistor 521, a driving transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driving transistor 522. The gate electrode layer of the driving transistor 522 is connected to a power supply line 527 through the capacitor 523, a first electrode of the driving transistor 522 is connected to the power supply line 527, and a second electrode of the driving transistor 522 is connected to a first electrode (pixel electrode) of the light-emitting element 524. A second electrode of the light-emitting element 524 corresponds to a common electrode 528. The common electrode 528 is electrically connected to a common potential line formed over the same substrate as the common electrode 528.

As the switching transistor 521 and the driving transistor 522, the transistor described in the above embodiment can be used as appropriate. When the deposition apparatus and the manufacturing apparatus described in the above embodiment are used to form an oxide semiconductor film the thickness uniformity of which is less than ±3% in a transistor, the transistor with less variation in electrical characteristics can be manufactured, and a display device with high display quality can be provided.

Note that the second electrode (the common electrode 528) of the light-emitting element 524 is set to have a low power supply potential. Note that the low power supply potential is a potential satisfying a relation the low power supply potential<a high power supply potential with reference to the high power supply potential that is set for the power supply line 527. As the low power supply potential, GND, 0 V, or the like may be employed, for example. In order to make the light-emitting element 524 emit light by applying a potential difference between the high power supply potential and the low power supply potential to the light-emitting element 524 so that current is supplied to the light-emitting element 524, each of the potentials is set so that the potential difference between the high power supply potential and the low power supply potential is higher than or equal to the forward threshold voltage of the light-emitting element 524.

Gate capacitance of the driving transistor 522 may be used as a substitute for the capacitor 523, in which case the capacitor 523 can be omitted. The gate capacitance of the driving transistor 522 may be formed between a channel formation region and the gate electrode layer.

In the case of a voltage-input voltage driving method, a video signal is input to the gate electrode layer of the driving transistor 522 so that the driving transistor 522 is in either of two states of being sufficiently turned on and turned off. That is, the driving transistor 522 operates in a linear region. The driving transistor 522 operates in a linear region, and thus, a voltage higher than the voltage of the power supply line 527 is applied to the gate electrode layer of the driving transistor 522. Note that a voltage higher than or equal to (power supply line voltage+Vth of the driving transistor 522) is applied to the signal line 525.

In the case of performing analog grayscale driving instead of digital time grayscale driving, the same pixel configuration as FIG. 7C can be used by changing signal input.

In the case of performing analog grayscale driving, a voltage higher than or equal to the sum of the forward voltage of the light-emitting element 524 and Vth of the driving transistor 522 is applied to the gate electrode layer of the driving transistor 522. The forward voltage of the light-emitting element 524 indicates a voltage at which a desired luminance is obtained, and includes at least a forward threshold voltage. A video signal by which the driving transistor 522 is operated in a saturation region is input, so that current can be supplied to the light-emitting element 524. In order for the driving transistor 522 to operate in a saturation region, the potential of the power supply line 527 is set to be higher than the gate potential of the driving transistor 522. Since the video signal is an analog signal, a current in accordance with the video signal can be supplied to the light-emitting element 524, and analog grayscale driving can be performed.

Note that the pixel structure is not limited to that illustrated in FIG. 7C. For example, a switch, a resistor, a capacitor, a sensor, a transistor, a logic circuit, or the like may be added to the pixel illustrated in FIG. 7C.

Embodiment 5

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the display device described in the above embodiment will be described.

Figure 8A:
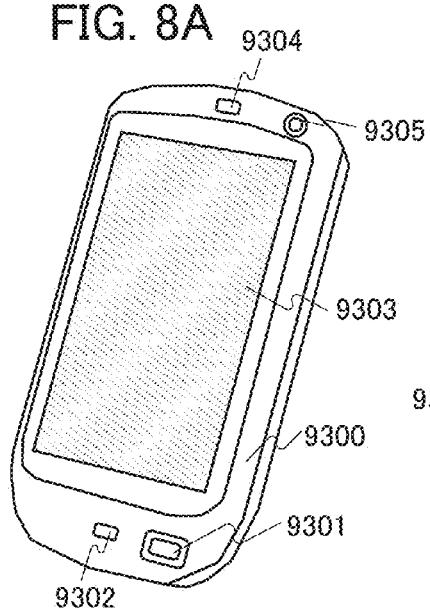
FIGS. 8A to 8D each illustrate an electronic device.

FIG. 8A illustrates a portable information terminal. The portable information terminal illustrated in FIG. 8A includes a housing 9300, a button 9301, a microphone 9302, a display portion 9303, a speaker 9304, and a camera 9305, and has a function as a mobile phone. One embodiment of the present invention can be applied to the display portion 9303 provided in a main body. When the deposition apparatus and the manufacturing apparatus described in the above embodiment are used to form an oxide semiconductor film the thickness uniformity of which is less than ±3% in a transistor in the display portion 9303, the transistor with less variation in electrical characteristics can be manufactured, and the display portion 9303 with high display quality can be provided.

Part or the whole of the display portion 9303 can function as a touch panel. By touching an operation key displayed on the touch panel, a user can make settings for a game or a call, for example.

Figure 8B:
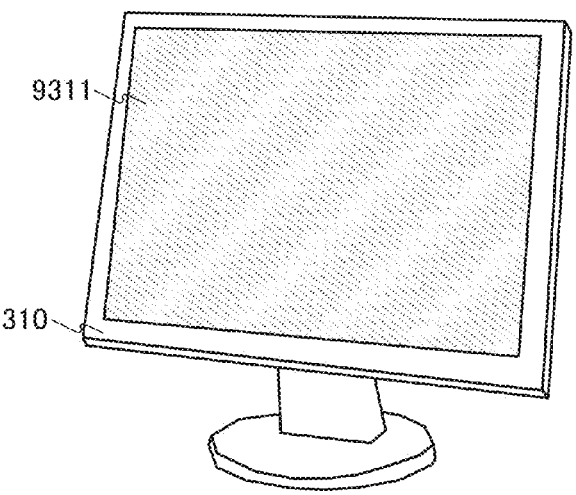

FIG. 8B illustrates a display. The display illustrated in FIG. 8B includes a housing 9310 and a display portion 9311. One embodiment of the present invention can be applied to the display portion 9311. When the deposition apparatus and the manufacturing apparatus described in the above embodiment are used to form an oxide semiconductor film the thickness uniformity of which is less than ±3% in a transistor in the display portion 9311, the transistor with less variation in electrical characteristics can be manufactured, and the display portion 9311 with high display quality can be provided.

Figure 8C:
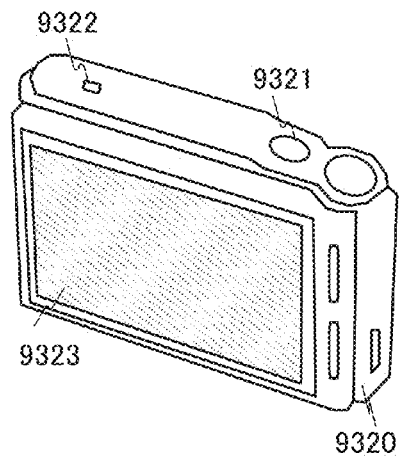

FIG. 8C illustrates a digital still camera. The digital still camera illustrated in FIG. 8C includes a housing 9320, a button 9321, a microphone 9322, and a display portion 9323. One embodiment of the present invention can be applied to the display portion 9323.

Part or the whole of the display portion 9323 can function as a touch panel. By touching an operation key displayed on the touch panel, a user can make settings for shooting such as still image shooting or moving image shooting, for example. One embodiment of the present invention can be applied to the display portion 9323 also in the case where the display portion 9323 is a touch panel.

Figure 8D:
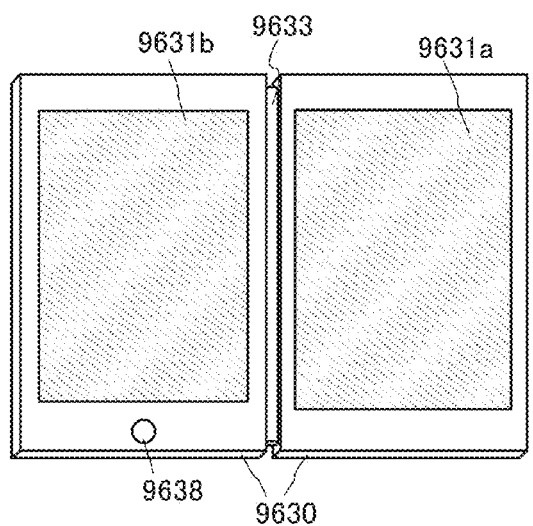

FIG. 8D illustrates a double-foldable portable information terminal. The double-foldable portable information terminal illustrated in FIG. 8D includes a housing 9630, a display portion 9631a, a display portion 9631b, a hinge 9633, and an operation switch 9638. One embodiment of the present invention can be applied to the display portion 9631a and the display portion 9631b.

Part or whole of the display portion 9631a and/or the display portion 9631b can function as a touch panel, which enables data input by touching an operation key displayed thereon. One embodiment of the present invention can be applied to the display portion 9631a and/or the display portion 9631b also in the case where the display portion 9631a and/or the display portion 9631b are/is a touch panel.

With use of a semiconductor device according to one embodiment of the present invention, an electronic device with stable electrical characteristics and high reliability can be provided.

Embodiment 6

In this embodiment, deposition models of a CAAC-OS and an nc-OS will be described.

Figure 9A:
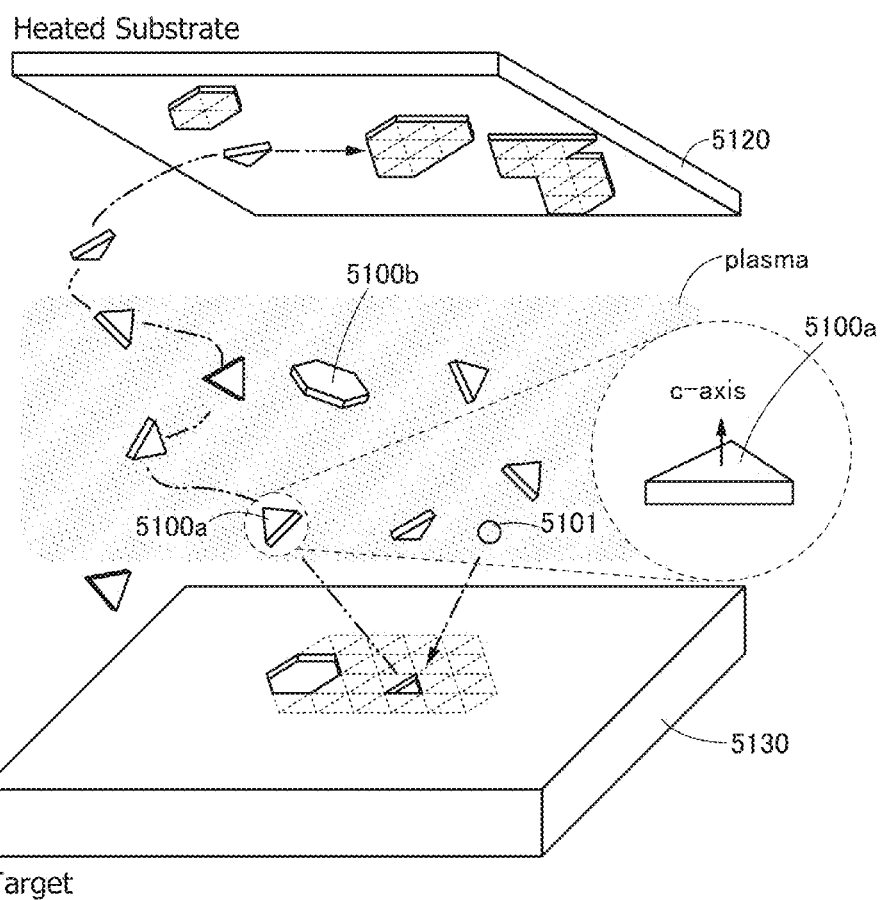
FIGS. 9A to 9C are a schematic diagram illustrating a deposition model of a CAAC-OS and a pellet, and cross-sectional views of a CAAC-OS.

FIG. 9A is a schematic view of the inside of a deposition chamber where a CAAC-OS is deposited by a sputtering method.

A target 5130 is attached to a backing plate. Under the target 5130 and the backing plate, a plurality of magnets are provided. The plurality of magnets cause a magnetic field over the target 5130. A sputtering method in which the deposition rate is increased by utilizing the magnetic field caused by the magnets is called a magnetron sputtering method. By swinging the magnets, the condition of magnetic force lines on the substrate can be relatively changed. A region with a strong magnetic field over the target 5130 changes with swing of the magnets. The region with a strong magnetic field becomes a high-density plasma region, and the sputtering of the target 5130 is easily caused in the vicinity of the region. For example, when a strong magnetic field is generated in a specific region, only the specific region in the target 5130 is used. By swinging the magnets, the target 5130 can be uniformly used, and accordingly, a film with a uniform thickness and quality can be deposited.

The target 5130 has a polycrystalline structure in which a cleavage plane exists in at least one crystal grain. Note that the details of the cleavage plane are described later.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5130, and plasma is observed. Note that the magnetic field over the target 5130 forms a high-density plasma region. In the high-density plasma region, the deposition gas is ionized, so that an ion 5101 is generated. Examples of the ion 5101 include an oxygen cation ($O^+$) and an argon cation ($Ar^+$).

The ion 5101 is accelerated toward the target 5130 side by an electric field, and collides with the target 5130 eventually. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that a flat-plate-like (pellet-like) sputtered particle such as the pellet 5100a and the pellet 5100b is collectively called a pellet 5100. The shape of a flat plane of the pellet 5100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 5100 is determined depending on the kind of deposition gas and the like. The thicknesses of the pellets 5100 are preferably uniform; the reasons thereof are described later. In addition, it is preferable for the sputtered particle to have a pellet shape with a small thickness than a dice shape with a large thickness.

Figure 11:
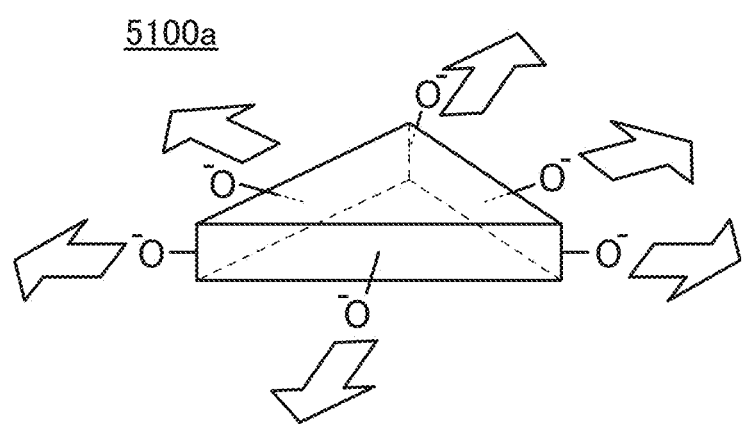
FIG. 11 illustrates a pellet.

The pellet 5100 receives a charge when passing through the plasma, so that side surfaces thereof are negatively or positively charged in some cases. The pellet 5100 includes an oxygen atom on its side surface, and the oxygen atom may be negatively charged. For example, a case in which the pellet 5100a includes, on its side surfaces, oxygen atoms that are negatively charged is illustrated in FIG. 11. As in this view, when the side surfaces are charged in the same polarity, charges repel each other, and accordingly, the pellet 5100a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, and a zinc atom is negatively charged.

Figure 12:
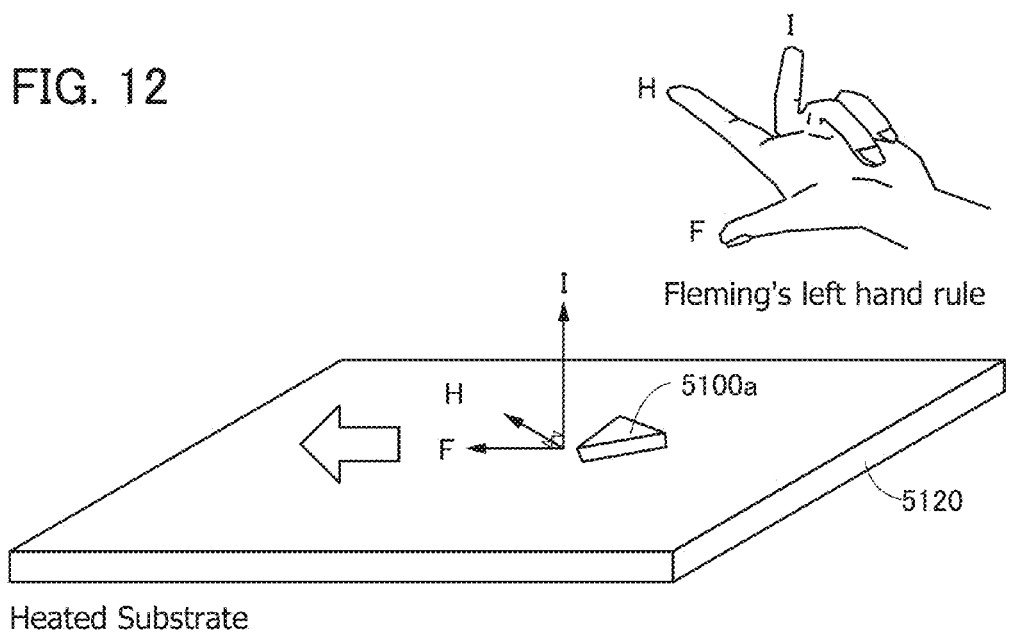
FIG. 12 illustrates force applied to a pellet on a film formation surface.

As illustrated in FIG. 9A, the pellet 5100 flies like a kite in plasma and flutters up to the substrate 5120. Since the pellets 5100 are charged, when the pellet 5100 gets close to a region where another pellet 5100 has already been deposited, repulsion is generated. Here, in the vicinity of a surface of the substrate 5120, a magnetic field is generated in a direction parallel to the surface of the substrate 5120. A potential difference is given between the substrate 5120 and the target 5130, and accordingly, current flows from the substrate 5120 toward the target 5130. Thus, the pellet 5100 is given a force (Lorentz force) on a surface of the substrate 5120 by an effect of the magnetic field and the current (see FIG. 12). This is explainable with Fleming's left-hand rule. In order to increase a force applied to the pellet 5100, it is preferable to provide, on the surface, a region where the magnetic field in a direction parallel to the surface of the substrate 5120 is 10 G or higher, preferably 20 G or higher, further preferably 30 G or higher, still further preferably 50 G or higher. Alternatively, it is preferable to provide, on the surface, a region where the magnetic field in a direction parallel to the surface of the substrate 5120 is 1.5 times or higher, preferably twice or higher, further preferably 3 times or higher, still further preferably 5 times or higher as high as the magnetic field in a direction perpendicular to the surface of the substrate 5120.

Figure 13A:
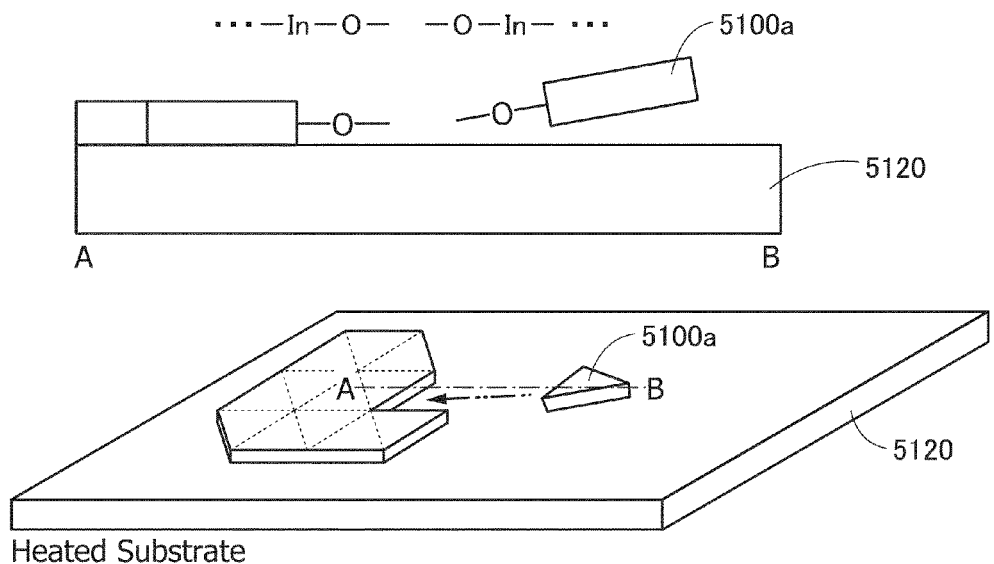
FIGS. 13A and 13B illustrate transfer of pellets on film formation surfaces.
Figure 13B:
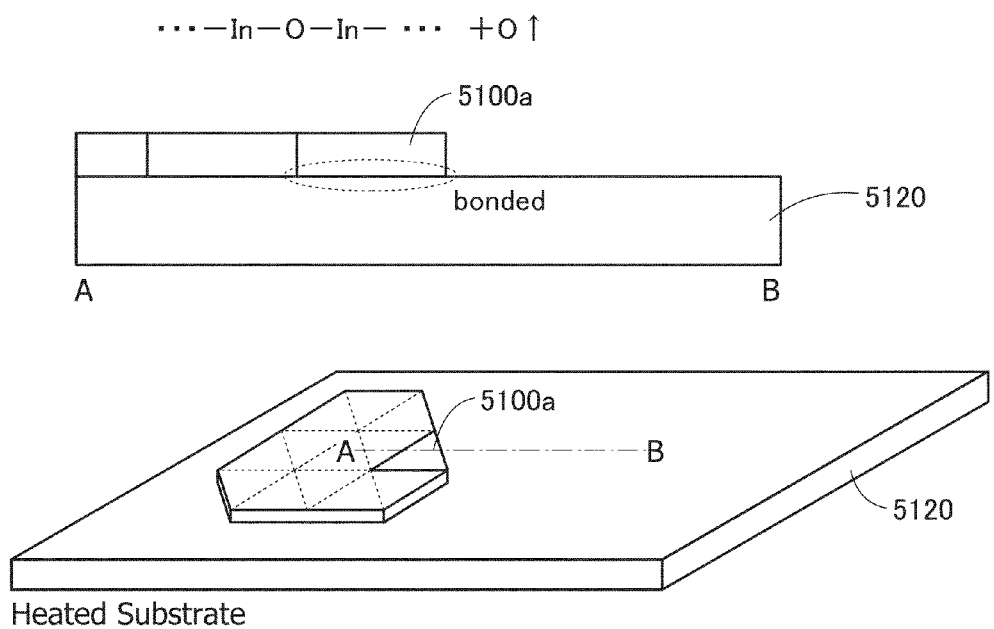

Further, the substrate 5120 is heated, and the resistance such as friction between the pellet 5100 and the substrate 5120 is low. As a result, as illustrated in FIG. 13A, the pellet 5100 glides above the surface of the substrate 5120. The glide of the pellet 5100 is caused in a state where the flat plane faces the substrate 5120. Due to swing of the magnets, the condition of magnetic force lines on the substrate is changed. The pellet 5100 is moved by force attributed to the effect of the magnetic field and the current. Then, as illustrated in FIG. 13B, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states.

Further, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occurs, which is caused by turning the pellet 5100 to be substantially single crystal. Thus, formation of defects such as a grain boundary due to expansion of a space between the pellets 5100 can be prevented, and accordingly, generation of crevasses can be prevented. Further, the space is filled with elastic metal atoms and the like, whereby the elastic metal atoms have a function, like a highway, of jointing side surfaces of the pellets 5100 which are not aligned with each other.

It is considered that as shown in such a model, the pellets 5100 are deposited on the substrate 5120. Thus, a CAAC-OS film can be deposited even when a surface over which a film is formed (film formation surface) does not have a crystal structure, which is different from film deposition by epitaxial growth. For example, even when a surface (film formation surface) of the substrate 5120 has an amorphous structure, a CAAC-OS film can be formed.

Figure 9B:
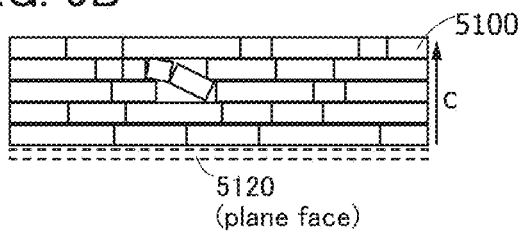

Further, it is found that in formation of the CAAC-OS, the pellets 5100 are arranged in accordance with a surface shape of the substrate 5120 that is the film formation surface even when the film formation surface has unevenness besides a flat surface. For example, in the case where the surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS film can be obtained (see FIG. 9B).

Figure 9C:
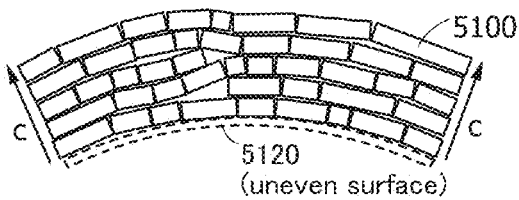

In the case where the surface of the substrate 5120 has unevenness, a CAAC-OS film in which n layers (n is a natural number) in each of which the pellets 5100 are arranged along the convex surface are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the film formation surface has unevenness, a CAAC-OS film with high crystallinity can be formed (see FIG. 9C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that when the sputtered particles has a dice shape with a large thickness, planes facing the substrate 5120 vary, which may lead to formation of a film whose thickness or crystal alignment is not uniformed.

According to the deposition model described above, a CAAC-OS with high crystallinity can be formed even on a film formation surface with an amorphous structure.

Further, formation of a CAAC-OS can be described with a deposition model including a zinc oxide particle besides the pellet 5100.

The zinc oxide particle reaches the substrate 5120 before the pellet 5100 does because the zinc oxide particle is smaller than the pellet 5100 in mass. On the surface of the substrate 5120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 5120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

An nc-OS can be understood with a deposition model illustrated in FIG. 10. Note that a difference between FIG. 10 and FIG. 9A lies only in the fact that whether the substrate 5120 is heated or not.

Thus, the substrate 5120 is not heated, and a resistance such as friction between the pellet 5100 and the substrate 5120 is high. As a result, the pellets 5100 cannot glide on the surface of the substrate 5120 and are stacked randomly, thereby forming a nc-OS.

<Cleavage Plane>

A cleavage plane that has been mentioned in the deposition model of the CAAC-OS will be described below.

Figure 14A:
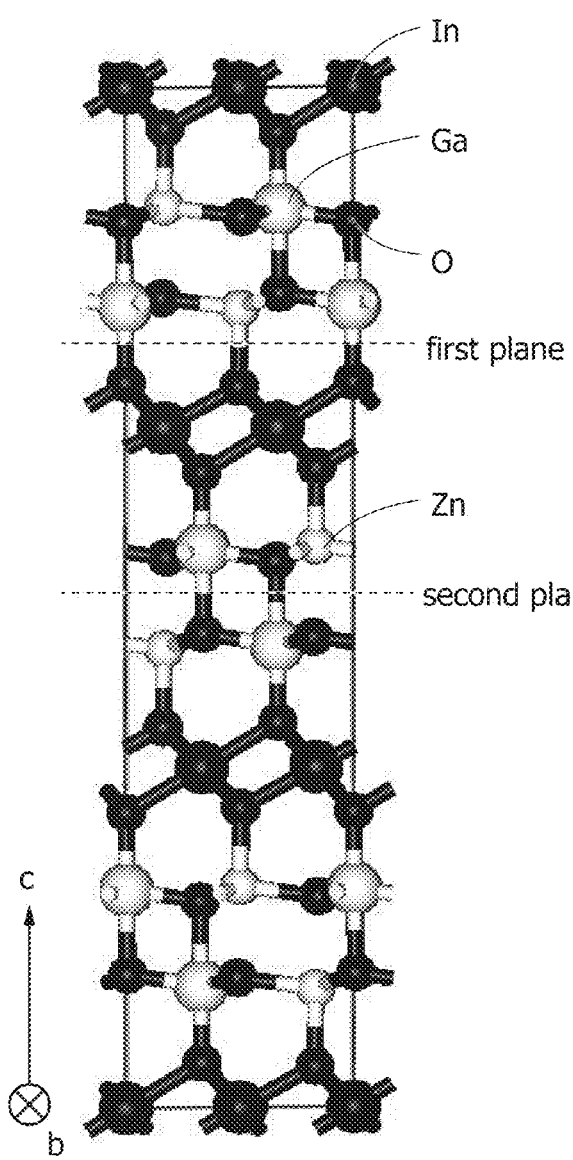
FIGS. 14A and 14B illustrate a crystal of $InGaZnO_4$.
Figure 14B:
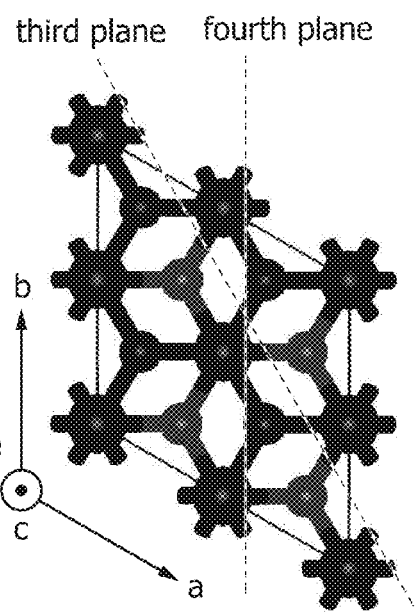

First, a cleavage plane of a target is described with reference to FIGS. 14A and 14B. FIGS. 14A and 14B show a structure of an $InGaZnO_4$ crystal. Note that FIG. 14A shows a structure of the case where the $InGaZnO_4$ crystal is observed from a direction parallel to the b-axis when the c-axis is in an upward direction. Further, FIG. 14B shows a structure of the case where the $InGaZnO_4$ crystal is observed from a direction parallel to the c-axis.

Energy needed for cleavage at each of crystal planes of the $InGaZnO_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the $InGaZnO_4$ crystal shown in FIGS. 14A and 14B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 14A). The second plane is a crystal plane between a Ga—Zn—O layer and a Ga—Zn—O layer and is parallel to the (001) plane (or the a-b plane) (see FIG. 14A). The third plane is a crystal plane parallel to the (110) plane (see FIG. 14B). The fourth plane is a crystal plane parallel to the (100) plane (or the b-c plane) (see FIG. 14B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane is 2.60 $J/m^2$, that of the second plane is 0.68 $J/m^2$, that of the third plane is 2.18 $J/m^2$, and that of the fourth plane is 2.12 $J/m^2$ (see Table 1).

TABLE 1

|  | Cleavage Energy [J/m$^2$] |
| --- | --- |
| First Plane | 2.60 |
| Second Plane | 0.68 |
| Third Plane | 2.18 |
| Fourth Plane | 2.12 |

From the calculations, in the structure of the InGaZnO$_4$ crystal shown in FIGS. 14A and 14B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 14A can be separated at two planes equivalent to the second plane. Thus, it is considered that when an ion or the like collides with the target, a wafer unit cleaved at the plane with the lowest cleavage energy (we called this unit "pellet") is separated off as the minimum unit. In that cases, a pellet of InGaZnO$_4$ is composed of three layers of a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 15A:
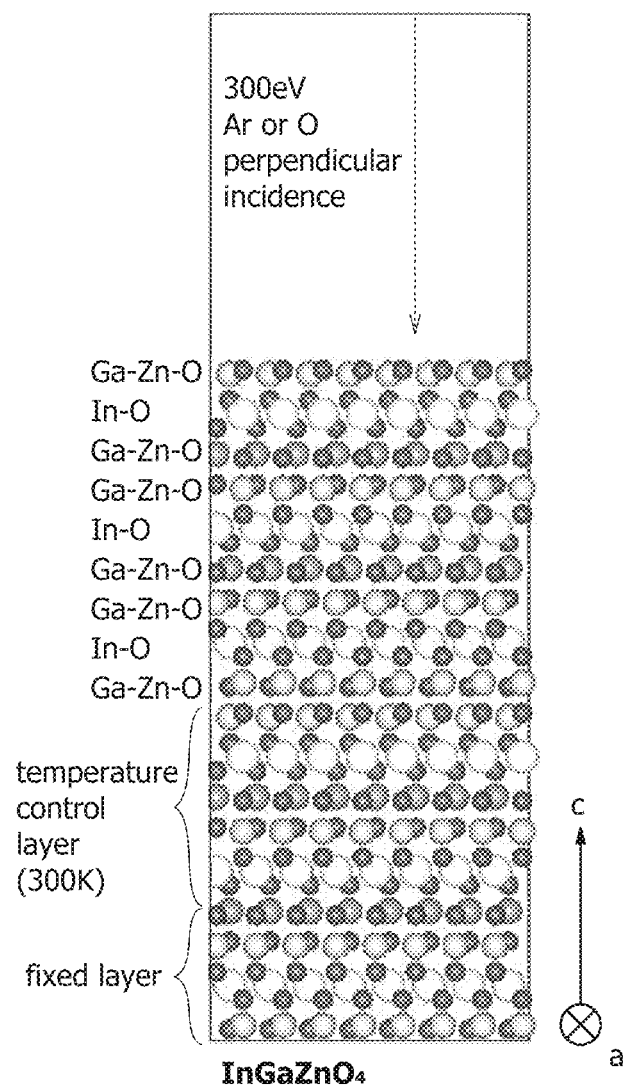
FIGS. 15A and 15B illustrate a structure of $InGaZnO_4$ and the like before an atom collides.
Figure 15B:
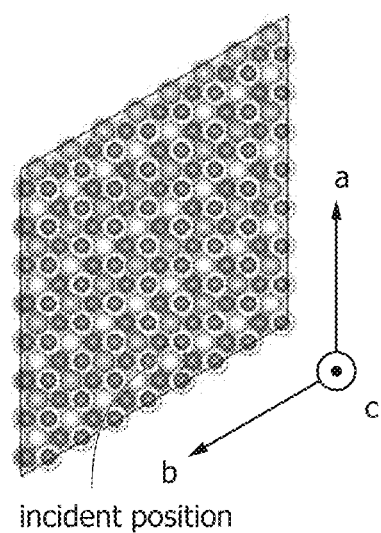

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 15A shows a cross-sectional structure of an InGaZnO$_4$ crystal (2688 atoms) used for the calculation, and FIG. 15B shows a top structure thereof. Note that a fixed layer in FIG. 15A is a layer which prevents the positions of the atoms from moving. A temperature control layer in FIG. 15A is a layer whose temperature is constantly set to a fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

Figure 16A:
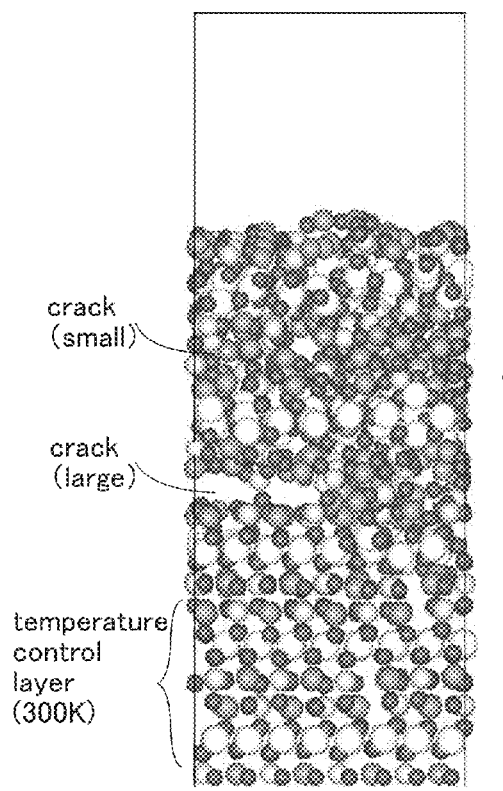
FIGS. 16A and 16B illustrate a structure of $InGaZnO_4$ and the like after an atom collides.
Figure 16B:
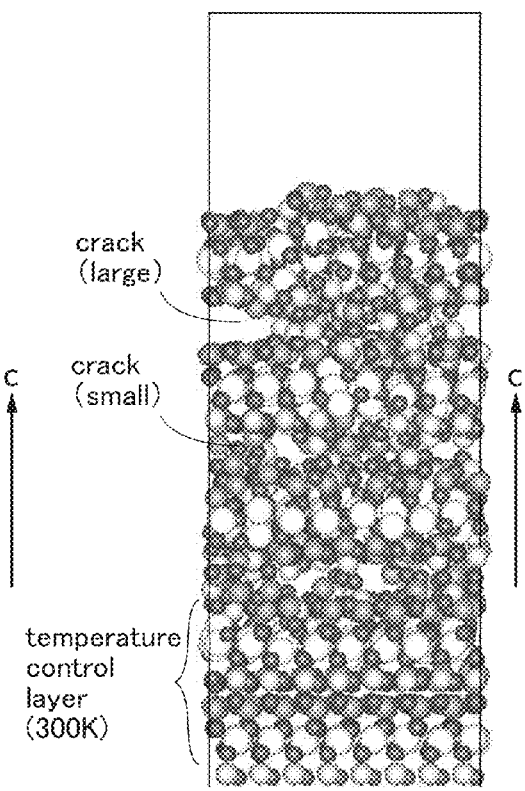

FIG. 16A shows an atomic arrangement when 99.9 picoseconds have passed after argon enters the cell including the InGaZnO$_4$ crystal shown in FIGS. 15A and 15B. FIG. 16B shows an atomic arrangement when 99.9 picoseconds have passed after oxygen enters the cell. Note that in FIGS. 16A and 16B, part of the fixed layer in FIG. 15A is omitted.

According to FIG. 16A, in a period from entry of argon into the cell to when 99.9 picoseconds have passed, a crack is formed from the cleavage plane corresponding to the second plane shown in FIG. 14A. Thus, in the case where argon collides with the InGaZnO$_4$ crystal and the uppermost surface is the second plane (the zero-th), a large crack is found to be formed in the second plane (the second).

On the other hand, according to FIG. 16B, in a period from entry of oxygen into the cell to when 99.9 picoseconds have passed, a crack is found to be formed from the cleavage plane corresponding to the second plane shown in FIG. 14A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a way that a defect caused by the damage reacts with oxygen.

Here, difference in size of the pellet depending on atoms which are made to collide is studied.

Figure 17A:
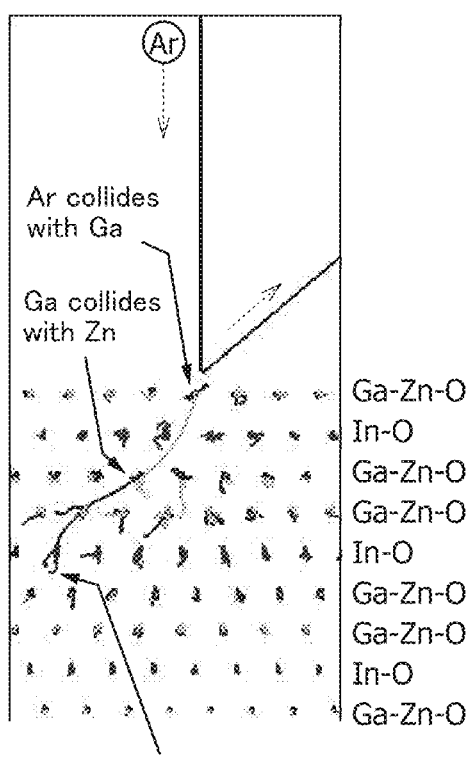
FIGS. 17A and 17B illustrate a tracjectory of an atom after collision.

FIG. 17A shows trajectories of the atoms from 0 picosecond to 0.3 picoseconds after argon enters the cell including the InGaZnO$_4$ crystal shown in FIGS. 15A and 15B. Accordingly, FIG. 17A corresponds to a period from FIGS. 15A and 15B to FIG. 16A.

According to FIG. 17A, when argon collides with gallium (Ga) of the first layer (Ga—Zn—O layer) counted from the top, the gallium collides with zinc (Zn) of the third layer (Ga—Zn—O layer) counted from the top and then, the zinc reaches the vicinity of the sixth layer (Ga—Zn—O layer) counted from the top. Note that the argon which collides with the gallium is sputtered to the outside. Accordingly, in the case where argon collides with the target including the InGaZnO$_4$ crystal, a crack is thought to be formed in the second plane (the second) in FIG. 15A.

Figure 17B:
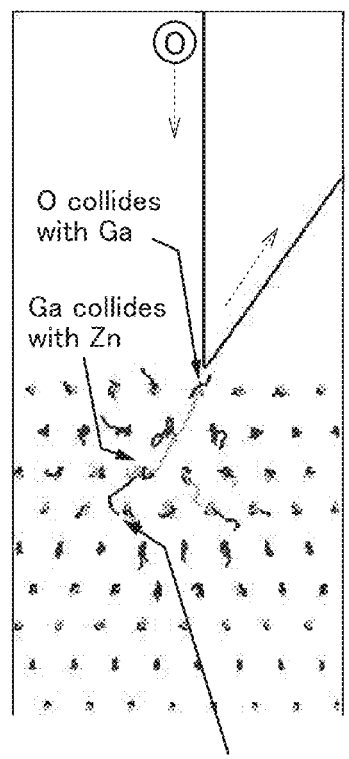

FIG. 17B shows trajectories of the atoms from 0 picosecond to 0.3 picoseconds after oxygen enters the cell including the InGaZnO$_4$ crystal shown in FIGS. 15A and 15B. Accordingly, FIG. 17B corresponds to a period from FIGS. 15A and 15B to FIG. 16A.

On the other hand, according to FIG. 17B, when oxygen collides with gallium (Ga) of the first layer (Ga—Zn—O layer) counted from the top, the gallium collides with zinc (Zn) of the third layer (Ga—Zn—O layer) counted from the top and then, the zinc does not reach the fifth layer (In—O layer) counted from the top. Note that the oxygen which collides with the gallium is sputtered to the outside. Accordingly, in the case where oxygen collides with the target including the InGaZnO$_4$ crystal, a crack is thought to be formed in the second plane (the first) in FIG. 15A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]

$$E = \frac{1}{2}m_A v_A^2 + \frac{1}{2}m_A v_{Ga}^2 \quad (1)$$

[Formula 2]

$$m_A v_A + m_{Ga} v_{Ga} = m'_A v'_A + m'_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]

$$v'_A - v'_{Ga} = -(v_A - v_{Ga}) \quad (3)$$

From the formulae (1), (2), and (3), the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In the formula (4), mass of argon or oxygen is substituted into $m_A$, whereby the speeds of gallium after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when a target including the InGaZnO$_4$ crystal having a homologous structure is sputtered, separation occurs from the cleavage plane to form a pellet. In contrast, when a region of a target having no cleavage plane is sputtered, a pellet is not formed. In that case, a sputtered particle at an atomic level that is finer than the pellet is formed. Since the sputtered particle is smaller than the pellet, it is considered that the sputtered particle is removed through a vacuum pump connected to the sputtering apparatus. Thus, it is quite unlikely to form a model by stacking particles which have various sizes and shapes and reach the substrate when a target including an InGaZnO$_4$ crystal having a homologous structure is sputtered. The model illustrated in FIG. 9A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 18A:
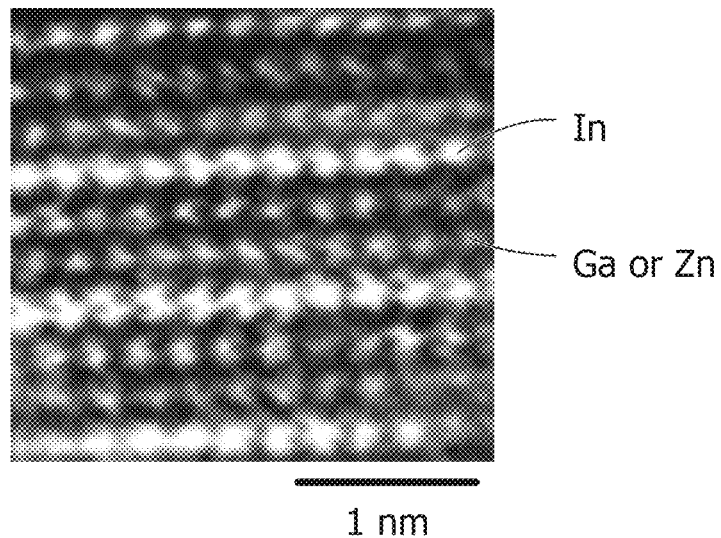
FIGS. 18A and 18B are cross-sectional HAADF-STEM images of a CAAC-OS and a target.
Figure 18B:
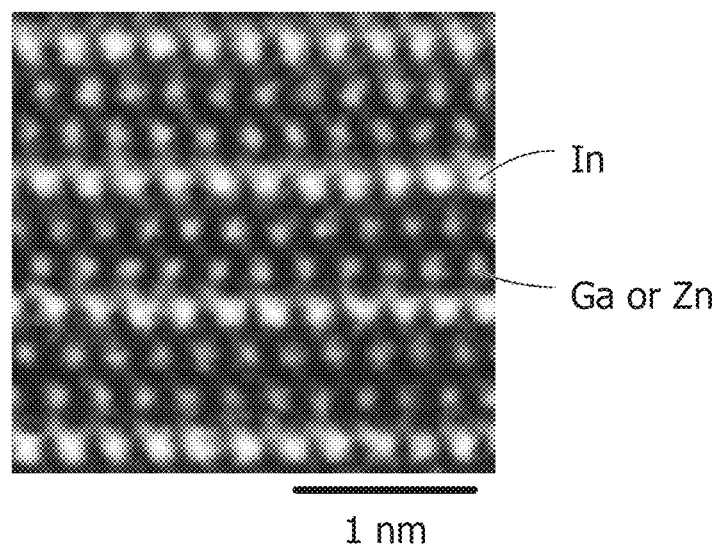

FIGS. 18A and 18B show atomic arrangements of cross sections of an In—Ga—Zn oxide (see FIG. 18A) that is a CAAC-OS deposited by a sputtering method and a target thereof (see FIG. 18B). For observation of atomic arrangement, a high-angle annular dark field scanning transmission electron microscopy (HAADF-STEM) is used. The contrast of the image of each of the atoms in a HAADF-STEM image is proportional to the square of its atomic number. Therefore, Zn (atomic number: 30) and Ga (atomic number: 31), which have close atomic numbers, are difficult to distinguish. A Hitachi scanning transmission electron microscope HD-2700 is used for the HAADF-STEM.

When FIG. 18A and FIG. 18B are compared, it is found that the CAAC-OS and the target each have a homologous structure and arrangements of atoms in the CAAC-OS correspond to those in the target. Thus, as illustrated in the deposition model in FIG. 9A, the crystal structure of the target is transferred, whereby a CAAC-OS is formed.

This application is based on Japanese Patent Application serial no. 2013-105621 filed with Japan Patent Office on May 17, 2013, the entire contents of which are hereby incorporated by reference.

What is claimed is:

1. A method for manufacturing a semiconductor device comprising the step of sputtering a material to form an oxide semiconductor layer over a substrate with use of a sputtering apparatus,
    wherein the sputtering apparatus comprises:
    a plurality of magnets; and
    a target holder over the plurality of magnets,
    wherein the plurality of magnets and a plurality of target groups over the target holder are moved from side to side during the step of sputtering,
    wherein the movement from side to side of the plurality of magnets and the movement from side to side of the plurality of target groups are independent with each other,
    wherein the movement from side to side of the plurality of target groups is not rotation, and
    wherein a thickness uniformity of the oxide semiconductor layer is less than ±3%.

2. The method for manufacturing a semiconductor device according to claim 1, wherein the thickness uniformity of the oxide semiconductor layer is less than or equal to ±2%.

3. The method for manufacturing a semiconductor device according to claim 1, further comprising the steps of:
    introducing the substrate into a deposition chamber of the sputtering apparatus that is vacuum evacuated and has a leakage rate lower than or equal to 1×10$^{-10}$ Pa·m$^3$/sec.; and
    introducing a deposition gas with a purity higher than or equal to 99.999999% to the deposition chamber,
    wherein the deposition gas is used in the step of sputtering.

4. The method for manufacturing a semiconductor device according to claim 1, wherein a substrate temperature during the step of sputtering is higher than or equal to 50° C. and lower than or equal to 450° C.

5. The method for manufacturing a semiconductor device according to claim 1, wherein the plurality of magnets are moved from side to side during the step of sputtering at a frequency greater than or equal to 0.1 Hz and less than or equal to 1 kHz is called swing.

6. The method for manufacturing a semiconductor device according to claim 1, wherein the movement from side to side of the plurality of magnets is not rotation.

7. An apparatus for manufacturing a semiconductor device comprising a sputtering apparatus comprising:

a supply source of a deposition gas;
a power supply;
a vacuum evacuation unit;
a substrate-heating unit;
a first swinging unit for moving a part of the sputtering apparatus from side to side,
a plurality of magnets;
a target holder over the plurality of magnets; and
a second swinging unit configured to move the target holder from side to side,
wherein the supply source, the power supply, the vacuum evacuation unit, the substrate-heating unit, and the first swinging unit are operationally connected with each other,
wherein a thickness uniformity of an oxide semiconductor layer formed with the sputtering apparatus is controlled by at least one of the first swinging unit for moving the part of the sputtering apparatus from side to side, an adjustment of the power supply, and an adjustment of a pressure in a deposition chamber of the sputtering apparatus, so that the thickness uniformity of the oxide semiconductor layer is less than ±3%,
wherein the first swinging unit is configured to move the plurality of magnets from side to side,
wherein the first swinging unit and the second swinging unit are configured to be operated independently with each other so that the plurality of magnets and the target holder are capable of moving from side to side independently with each other,
wherein the movement from side to side of the target holder is not rotation, and
wherein the movement from side to side of the plurality of magnets and the movement from side to side of the target holder are independent with each other.

8. The apparatus for manufacturing a semiconductor device according to claim 7, further comprising a refiner between the supply source of the deposition gas and the deposition chamber.

9. The apparatus for manufacturing a semiconductor device according to claim 7, wherein the first swinging unit is configured to move the plurality of magnets from side to side at a frequency greater than or equal to 0.1 Hz and less than or equal to 1 kHz is called swing.

10. The apparatus for manufacturing a semiconductor device according to claim 7, wherein the movement from side to side of the plurality of magnets is not rotation.

* * * * *